(12) United States Patent
Kumagai et al.

(10) Patent No.: US 6,243,286 B1
(45) Date of Patent: Jun. 5, 2001

(54) SEMICONDUCTOR MEMORY DEVICE AND METHOD OF FABRICATING THE SAME

(75) Inventors: Takashi Kumagai, Chino; Junichi Karasawa, Tatsuno-machi; Kazuo Tanaka; Kunio Watanabe, both of Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/361,095

(22) Filed: Jul. 26, 1999

(30) Foreign Application Priority Data

Jul. 27, 1998 (JP) .................................................. 10-226485

(51) Int. Cl.$^7$ .................................................. G11C 11/00
(52) U.S. Cl. .......................................... 365/154; 257/903
(58) Field of Search ........................ 365/154, 51; 257/903, 257/904, 368

(56) References Cited

U.S. PATENT DOCUMENTS

| | | | | |
|---|---|---|---|---|
| 5,198,683 | * | 3/1993 | Sivan ..................................... | 257/903 |
| 5,373,170 | * | 12/1994 | Pfiester et al. ........................ | 257/903 |
| 5,485,420 | * | 1/1996 | Lage et al. ............................. | 365/154 |
| 5,535,154 | * | 7/1996 | Kiyono ................................... | 365/154 |
| 5,777,920 | * | 7/1998 | Ishigaki et al. ....................... | 365/154 |
| 6,169,313 | * | 1/2001 | Tsutsumi et al. ..................... | 257/904 |

FOREIGN PATENT DOCUMENTS 09045796  2/1997 (JP) ........................... H01L/21/8244

\* cited by examiner

*Primary Examiner*—Son T. Dinh
(74) *Attorney, Agent, or Firm*—Hogan & Hartson, LLP

(57) ABSTRACT

An SRAM comprises first, second and third conductive layers. The first conductive layer is a gate electrode for a first load transistor and a first driver transistor. The second conductive layer branches from the first conductive layer on a field oxide region and is electrically connected to a second driver transistor active region. The third conductive layer is a gate electrode for a second load transistor and a second driver transistor. The third conductive layer is electrically connected to a first load transistor active region. The width of part of the second conductive layer on the field oxide region is less than the width of the first conductive layer.

14 Claims, 31 Drawing Sheets

SEMICONDUCTOR MEMORY DEVICE AND METHOD OF FABRICATING THE SAME

BACKGROUND OF THE INVENTION

1. Field of the Invention

The present invention relates to a semiconductor memory device, in particular, an SRAM and a method of fabricating the same.

2. Description of the Related Art

FIG. 32 is a plan view showing a memory cell of a conventional SRAM disclosed in Japanese Patent Application Laid-Open No. 45796/1997. Active regions 112a, 112b, 112c, and 112d are formed on the main surface of a silicon substrate 111. Source and drain regions in the active regions 112a and 112b are n-type and source and drain regions in the active regions 112c and 112d are p-type. These active regions 112a, 112b, 112c, and 112d are isolated from each other by a field oxide region 113.

A first conductive layer 116a extends from an area on the active region 112c to an area on the active region 112a. The first conductive layer 116a is a gate electrode for a load transistor $Q_6$ and a driver transistor $Q_4$.

A second conductive layer 116b branches from the first conductive layer 116a on the field oxide region 113 and extends toward an area on the active region 112b.

A third conductive layer 116c passes across the active region 112b and the active region 112d, bends on the field oxide region 113, and extends toward an area on the active region 112c. The third conductive layer 116c is a gate electrode for a load transistor $Q_5$ and a driver transistor $Q_3$. Note that access transistors $Q_1$ and $Q_2$ are not shown in this figure.

FIG. 33 is a cross section of the memory cell of the SRAM along the A—A line. A p-type well 110a and an n-type well 110b are formed on the silicon substrate 111. The active region 112a is formed on the p-type well 110a, and the active region 112c is formed on the n-type well 110b. The active region 112a is isolated from the active region 112c by the field oxide region 113.

The second conductive layer 116b is formed on the field oxide region 113. Side wall insulating films 117 are formed on the sides of the second conductive layer 116b.

The conventional SRAM shown in FIG. 32 has two problems. First problem will be described below.

The SRAM shown in FIG. 32 is formed by laminating a conductive layer and an insulating layer on the main surface of the silicon substrate 111. A mask alignment is indispensable in this lamination step. A mask alignment error may occur in such a mask alignment. FIG. 34 is a plan view of a memory cell showing a mask alignment error caused by a mask shifted in the direction of the Y axis at the time of forming the first conductive layer 116a, the second conductive layer 116b, and the third conductive layer 116c. FIG. 35 is a cross section of the memory cell of the SRAM shown in FIG. 34 along the A—A line.

In FIGS. 34 and 35, part of the second conductive layer 116b and the side wall insulating film 117 overlap the region designed to be the active region 112a. Because of this, the gate width of the gate electrode of the driver transistor $Q_4$ is W in the plan but actually is w, which is smaller than W. This causes an imbalance in the β ratio (capacity ratio of driver transistor to transfer transistor), causing the characteristics of the SRAM to deteriorate.

It is therefore necessary to take the mask alignment error into account when designing the layout of the SRAM. As shown in FIG. 33, the width of the field oxide region 113 must be wide enough to allow the second conductive layer 116b and the side wall insulating film 117 to be located on the field oxide region 113, even if the mask alignment error occurs. However, this goes against the need for a reduced memory cell size.

Second problem is as follows. FIG. 36 shows an end section of the active region 112c shown in FIG. 32. In the plan, the active region 112c is designed to be within a solid line 119, but actually, the active region 112c is formed within a broken line 120 due to a bird's beak 118. Since the active region is narrow in the end section of the active region 112c and oxidized from three directions in a LOCOS process, the effective active region is small as shown in FIG. 36. The active region 112c is in contact with an upper wiring layer. If the area of the active region 112c is small, the margin is reduced when the active region 112c is connected to the wiring in the upper layer.

SUMMARY OF THE INVENTION

The present invention has been achieved to solve the above problems. An object of the present invention is to provide a semiconductor memory device in which a memory cell can be miniaturized without causing an imbalance in the β ratio of the memory cell, and a method of fabricating the semiconductor device.

The present invention has, in addition to the above object, an object of providing a semiconductor memory device well contacted with the upper wiring layer and a method of fabricating such semiconductor memory device.

According a first aspect of the present invention, there is provided a semiconductor memory device having at least one memory cell that includes first and second load transistors and first and second driver transistors, the semiconductor memory device comprising:

a semiconductor substrate having a main surface;

a first load transistor active region which is formed on the main surface as an active region for the first load transistor;

a second load transistor active region which is formed on the main surface as an active region for the second load transistor;

a first driver transistor active region which is formed on the main surface as an active region for the first driver transistor;

a second driver transistor active region which is formed on the main surface as an active region for the second driver transistor;

a first element isolation region which is formed on the main surface to isolate the first load transistor active region from the first driver transistor active region;

a first conductive layer which extends from an area on the first load transistor active region to an area on the first driver transistor active region to be a gate electrode for the first load transistor and for the first driver transistor;

a second conductive layer which branches from the first conductive layer on the first element isolation region and is electrically connected to the second driver transistor active region, wherein the width of part of the second conductive layer positioned on the first element isolation region is less than the width of the first conductive layer; and a third conductive layer which is electrically connected to the first load transistor active region, passes across the second load transistor active region, and extends toward an area on the second driver transistor active region to be a gate electrode for the second load transistor and the second driver transistor.

In the semiconductor memory device according to the present invention, the width of part of the second conductive layer on the first element isolation region is smaller than the width of the first conductive layer. Hence the width of the second conductive layer on the first element isolation region can be less in comparison with the case where the width of the second conductive layer on the first element isolation region is the same as or larger than the width of the first conductive layer. So the width of the first element isolation region can also be less even if a mask alignment error is taken into account when forming the first through third conductive layers. Therefore, a memory cell can be miniaturized without causing an imbalance in the β ratio of the memory cell.

According to a second aspect of the present invention, there is provided a semiconductor memory device having at least one memory cell that includes first and second load transistors and first and second driver transistors, the semiconductor memory device comprising:

a semiconductor substrate having a main surface;
a first load transistor active region which is formed on the main surface as an active region for the first load transistor;
a second load transistor active region which is formed on the main surface as an active region for the second load transistor;
a first driver transistor active region which is formed on the main surface as an active region for the first driver transistor;
a second driver transistor active region which is formed on the main surface as an active region for the second driver transistor;
a first element isolation region which is formed on the main surface to isolate the first load transistor active region from the first driver transistor active region;
a first conductive layer which extends from an area on the first load transistor active region to an area on the first driver transistor active region to be a gate electrode for the first load transistor and the first driver transistor;
a second conductive layer which branches from the first conductive layer on the first element isolation region and is electrically connected to the second driver transistor active region, wherein the width of part of the second conductive layer positioned on the first element isolation region is the smallest width according to the processing rule for the second conductive layer; and
a third conductive layer which is electrically connected to the first load transistor active region, passes across the second load transistor active region, and extends to an area on the second driver transistor active region to be a gate electrode for the second load transistor and the second driver transistor.

In the semiconductor memory device according to the present invention, the width of part of the second conductive layer on the first element isolation region is the smallest width according to the processing rule for the second conductive layer. Hence the width of the first element isolation region can be decreased even if a mask alignment error is taken into account when forming the first through third conductive layers.

The semiconductor memory device may further comprise a side wall insulating film formed on the side surface of the second conductive layer on side of the first driver transistor active region, wherein the distance between part of the second conductive layer on the first element isolation region and the first driver transistor active region may be larger than the sum of the value of the alignment error produced at the time of patterning for the first, second and third conductive layers of the memory cell and the width of the side wall insulating film.

This structure prevents the second conductive layer and the side wall insulating film from being positioned on the first driver transistor active region. If the second conductive layer and the side wall insulating film are positioned on the first driver transistor active region, the gate width of the gate electrode for the first driver transistor is smaller than the designed value. This causes an imbalance in the β ratio of the memory cell, thereby causing the characteristics of the semiconductor memory device to deteriorate.

The distance between part of the second conductive layer on the first element isolation region and the first load transistor active region may be less than the distance between the second conductive layer on the first element isolation region and the first driver transistor active region.

If the second conductive layer and the side wall insulating film are positioned on the first driver transistor active region, the β ratio of the memory cell is adversely affected. If the second conductive layer and the side wall insulating film are positioned on the first load transistor active region and if the gate width of the load transistor is small, the β ratio of the memory cell is not affected. Because of this, the distance between the second conductive layer and the first load transistor active region can be less than the distance between the second conductive layer and the first driver transistor active region. Hence the width of the first element isolation region can be reduced thereby reducing the memory cell size.

The pattern of the first and second conductive layers may be in the shape of an "h" and the pattern of the third conductive layer may be in the shape of a "7".

The width of a contact region of the first load transistor active region used for electrical connection with the third conductive layer may be larger than the width of the other part of the first load transistor active region.

This makes it possible to increase the area of the contact region large enough to allow the electrical connection with the upper wiring layer even if a bird's beak is formed.

The semiconductor memory device may comprise a memory cell array that includes the memory cells,
wherein the memory cell array may include a second element isolation region that is formed on the main surface for isolating a memory cell in a first line of the memory cell array from a memory cell in a second line of the memory cell array, and
wherein the pattern of the first, second and third conductive layers of the memory cell in the second line of the memory cell array may be a pattern formed by rotating the pattern of the first, second and third conductive layers of the memory cell in the first line of the memory cell array around an axis that is perpendicular to the main surface by 180 degrees.

This can prevent punch-through between the first and second load transistor active regions of the memory cell in the first line and the first and second load transistor active regions of the memory cell in the second line.

The semiconductor memory device may comprise a memory cell array that includes the memory cells, wherein the memory cell array may include a second element isolation region that is formed on the main surface for isolating a memory cell in a first line of the memory cell array from a memory cell in a second line of the memory cell array, and wherein the pattern of the first, second and third conductive layers of the memory cell in the second line of the memory cell array may be a mirror image of the pattern of the first, second and third conductive layers of the memory cell in the first line of the memory cell array. When the both are mirror images, the pattern is simplified and therefore a large margin for a mask shift (in a lateral direction) can be allowed.

According to a third aspect of the present invention, there is provided a method of fabricating a semiconductor memory device having a memory cell comprising first and second load transistors and first and second driver transistors, the method comprising the steps of:

forming an element isolation region, a first load transistor active region, a second load transistor active region, a first driver transistor active region, and a second driver transistor active region on a main surface of a semiconductor substrate;

forming a conductive layer that covers the main surface; and patterning the conductive layer to form a first conductive layer, a second conductive layer, and a third conductive layer;

wherein the first conductive layer extends from an area on the first load transistor active region to an area on the first driver transistor active region to be a gate electrode for the first load transistor and the first driver transistor;

wherein the second conductive layer branches from the first conductive layer on the element isolation region and extends to an area on the second driver transistor active region;

wherein the width of part of the second conductive layer on the element isolation region is less than the width of the first conductive layer; and wherein the third conductive layer extends from an area on the second load transistor active region to an area on the second driver transistor active region to be a gate electrode for the second load transistor and the second driver transistor, the method of fabricating a semiconductor memory device further comprising the steps of:
electrically connecting the second conductive layer to the second driver transistor active region; and
electrically connecting the third conductive layer to the first load transistor active region.

In the method of fabricating a semiconductor memory device, the method may comprise the step of forming a side wall insulating film on the side surface of the second conductive layer.

In the step of patterning the conductive layer, the distance between part of the second conductive layer on the element isolation region and the first driver transistor active region may be larger than the sum of the value of an alignment error produced at the time patterning for the first, second and third conductive layers of the memory cell and the width of the side wall insulating film.

In the step of patterning the conductive layer, the width of part of the second conductive layer on the element isolation region may be the smallest width according to the processing rule for the second conductive layer.

In the step of patterning the conductive layer, the distance between part of the second conductive layer on the element isolation region and the first load transistor active region may be less than the distance between the second conductive layer on the element isolation region and the first driver transistor active region.

In the step of forming the first load transistor active region, the width of a contact region of the first load transistor active region used for electrical connection with the third conductive layer may be larger than the width of the other part of the first load transistor active region.

DESCRIPTION OF PREFERRED EMBODIMENT

First Embodiment

Description of Planar Structure

Figure 1:
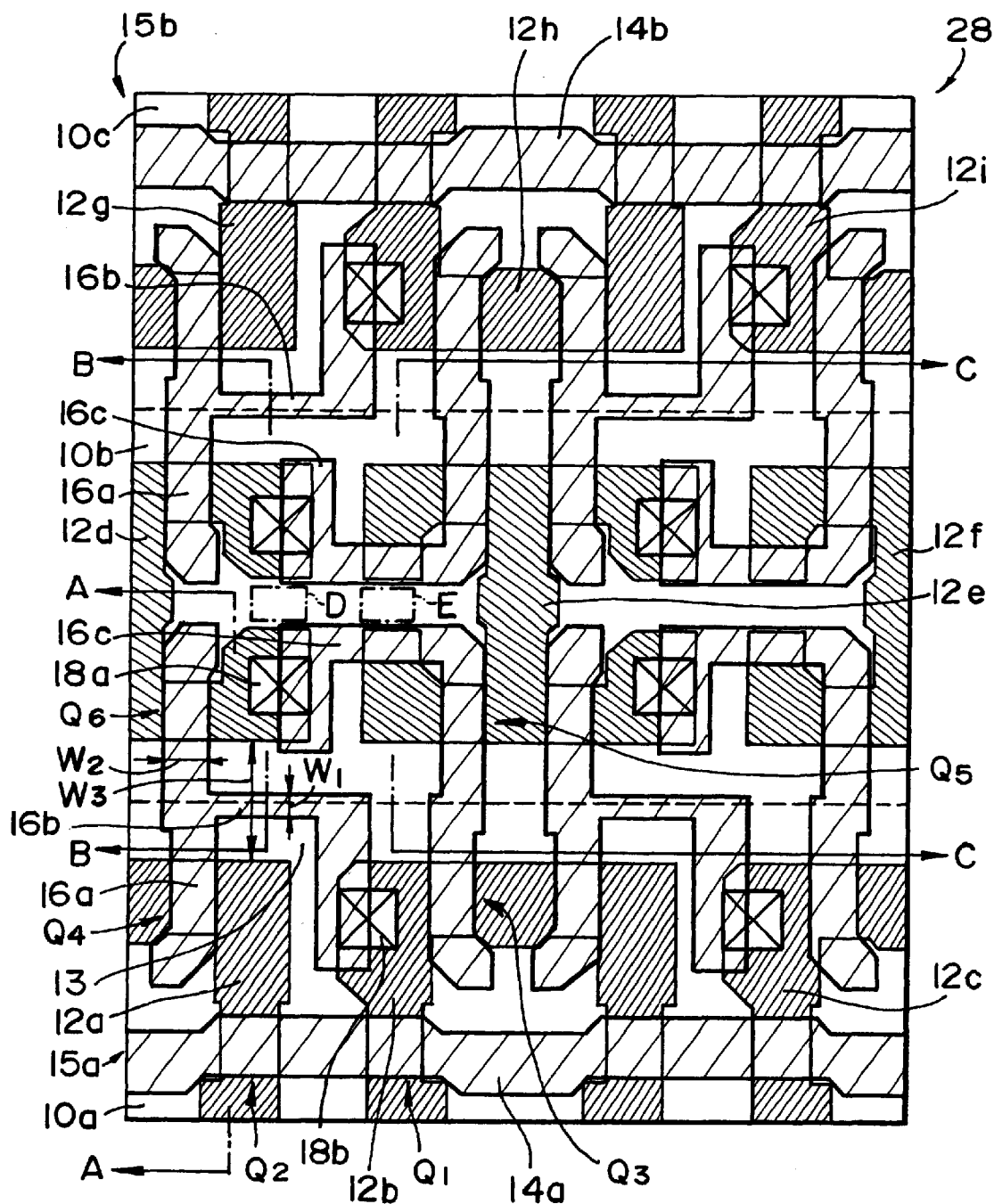
FIG. 1 is a plan view showing part of an element formation layer of a memory cell array of an SRAM according to a first embodiment of the present invention.
Figure 16:
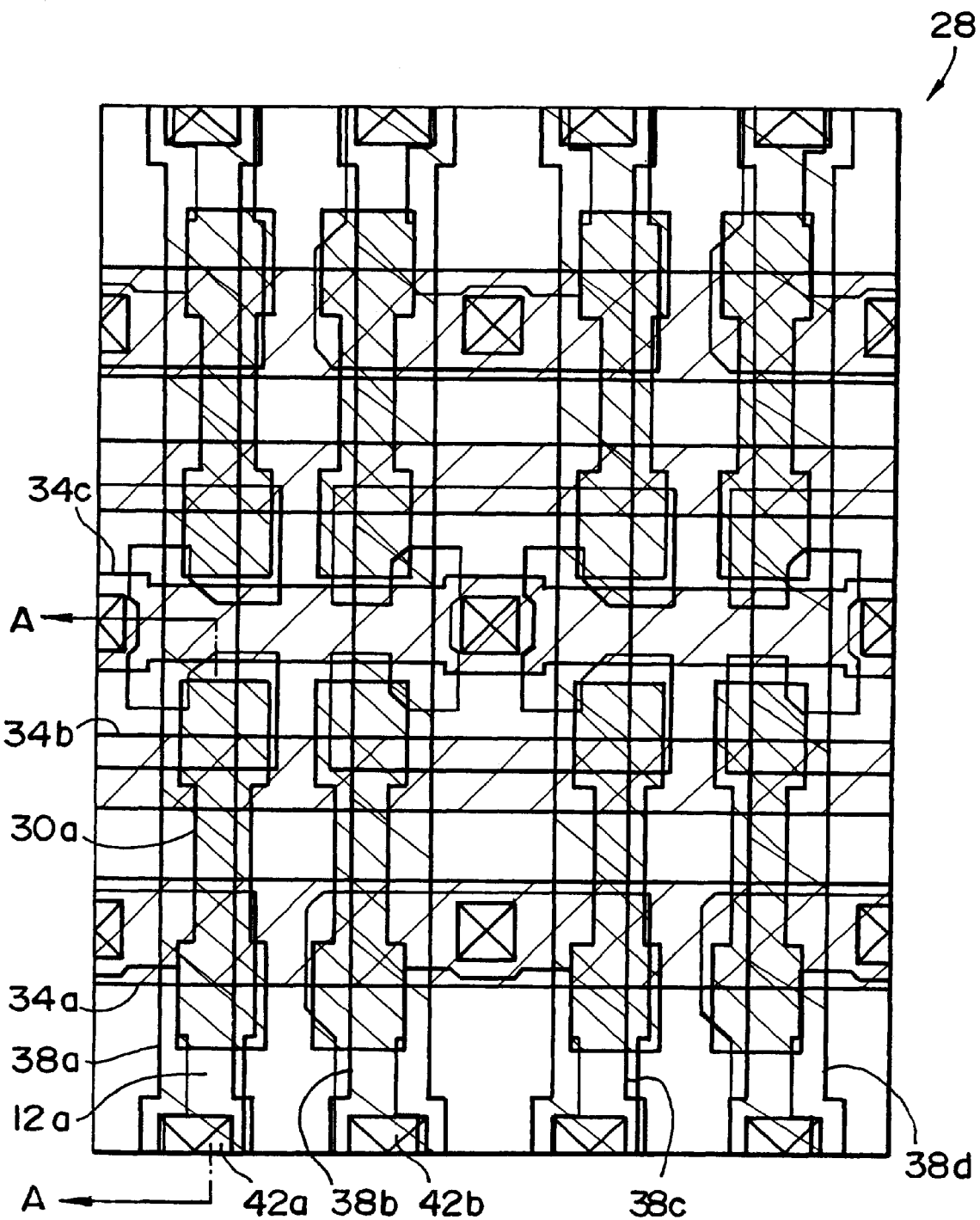
FIG. 16 is a plan view showing part of wirings of a memory cell array of the SRAM according to the first embodiment of the present invention.

FIGS. 1 and 16 are plan views showing part of a memory cell array of an SRAM according to a first embodiment of the present invention. FIG. 1 shows an element formation layer. FIG. 16 shows a wiring layer formed on the element formation layer shown in FIG. 1. The structure shown in FIG. 1 will be first described from the lowest layer with reference to FIGS. 2–7.

Figure 2:
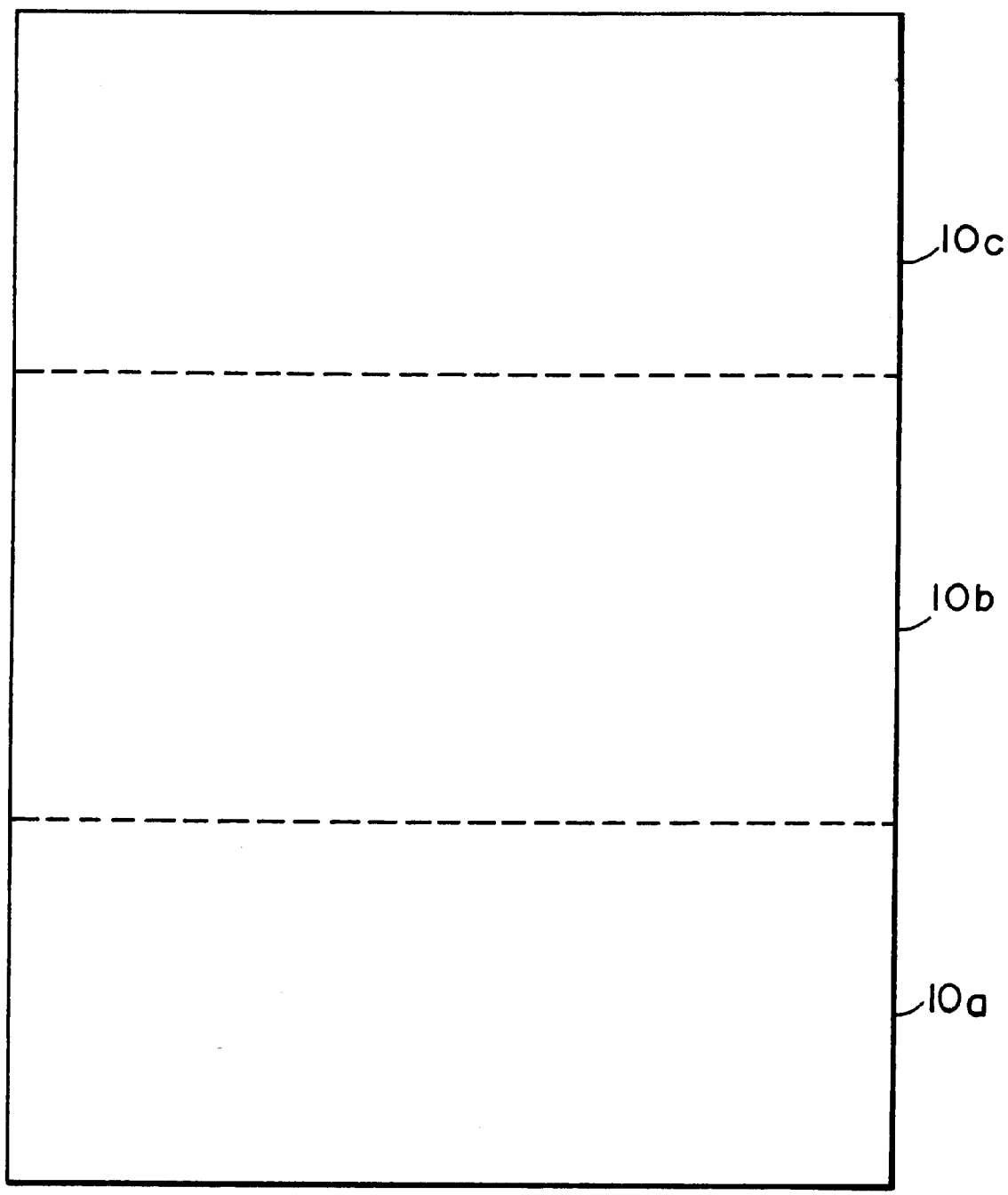
FIG. 2 is a plan view showing a pattern of a well of the SRAM according to the first embodiment of the present invention.
Figure 3:
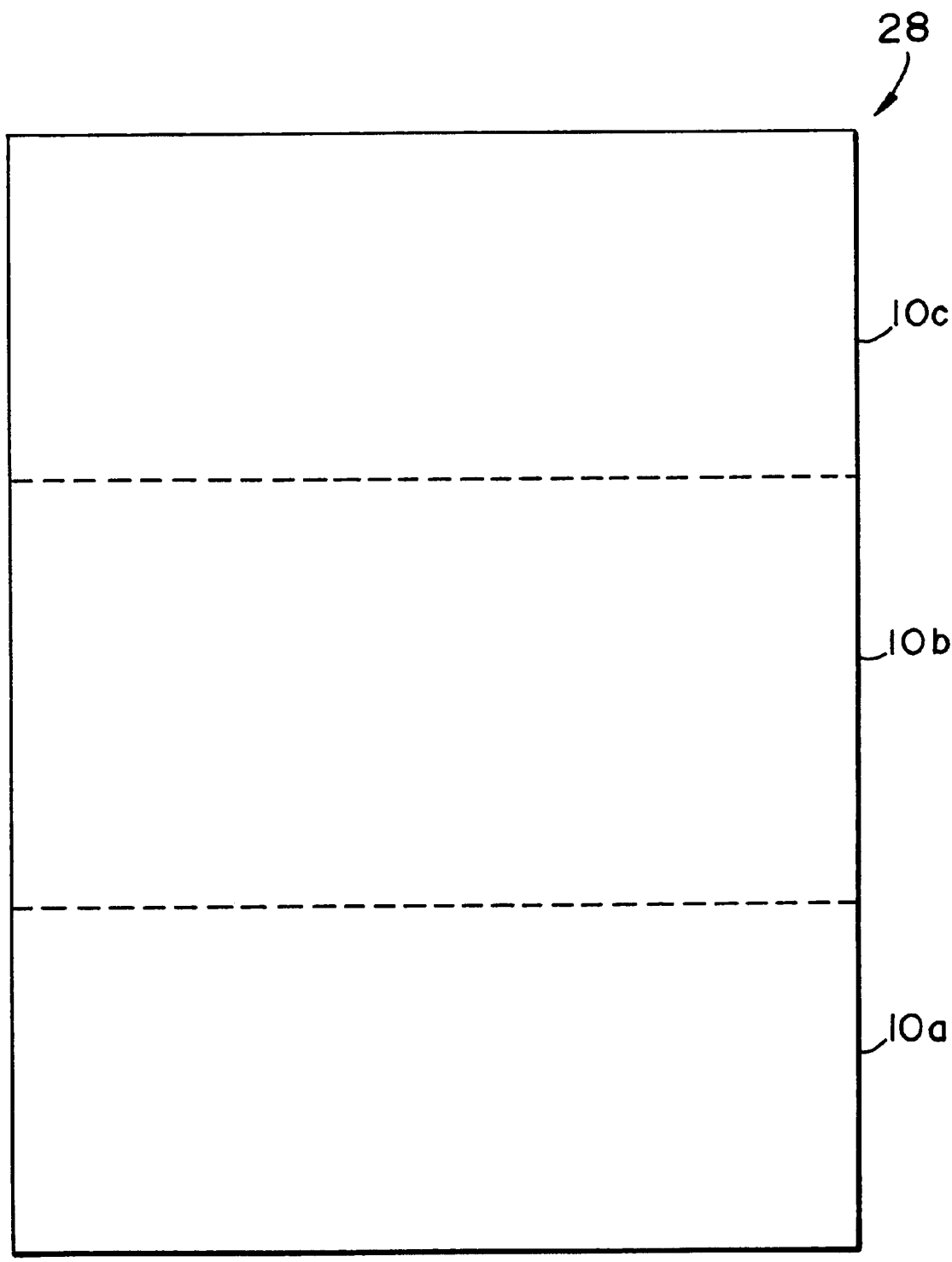
FIG. 3 is a plan view showing a pattern of a well formed on the main surface of a silicon substrate used in the SRAM according to the first embodiment of the present invention.

FIG. 2 is a plan view showing a pattern of a p-type well 10a, n-type well 10b and p-type well 10c. FIG. 3 is a plan view showing a pattern of a p-type well 10a, n-type well 10b, and p-type well 10c formed on a main surface of a silicon substrate 28 that is an example of a semiconductor substrate.

Figure 4:
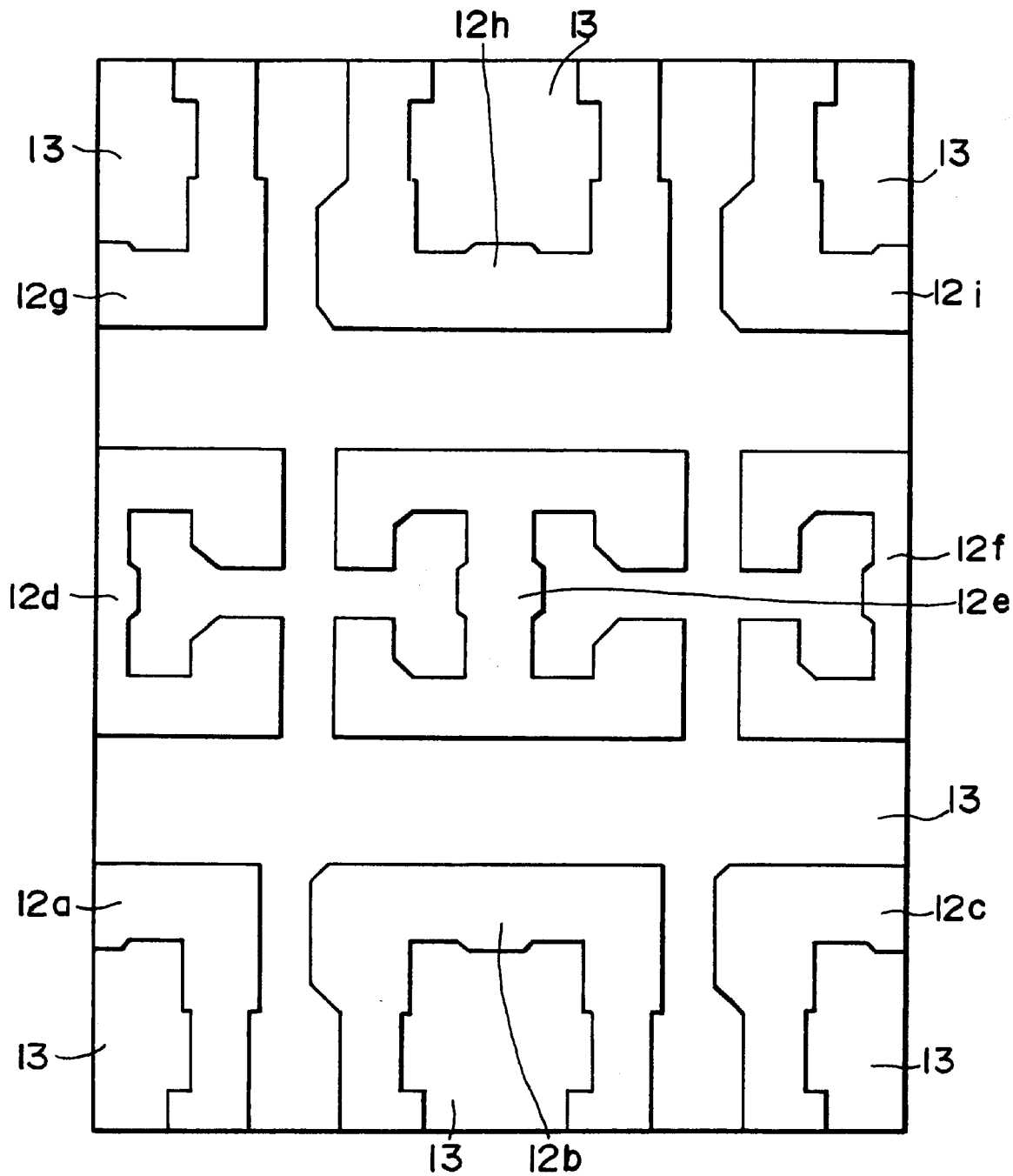
FIG. 4 is a plan view showing a pattern of an active region and a field oxide region of the SRAM according to the first embodiment of the present invention.
Figure 5:
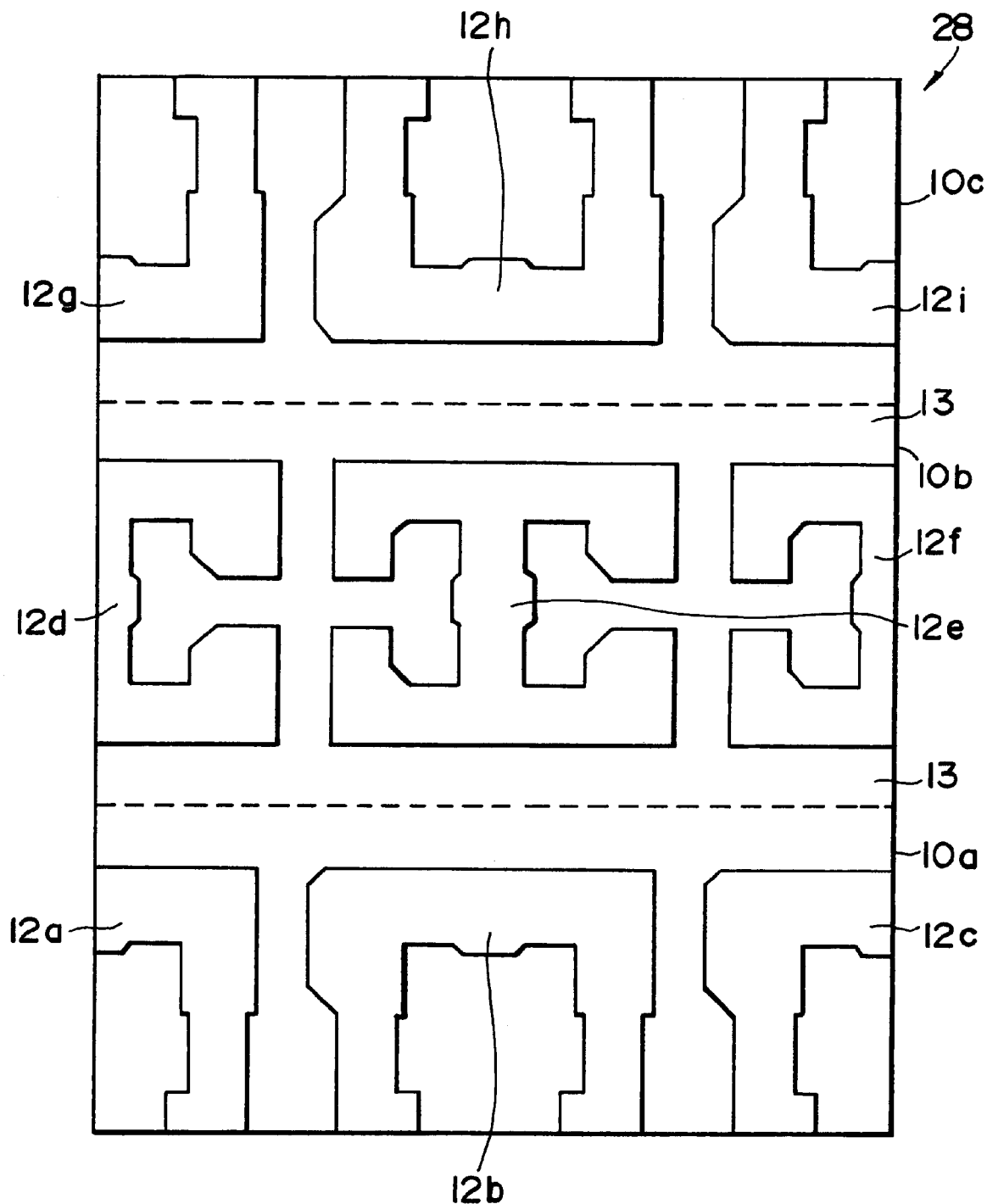
FIG. 5 is a plan view showing a pattern of an active region and a field oxide region formed on the main surface of a silicon substrate used in the SRAM according to the first embodiment of the present invention.

FIG. 4 is a plan view showing a pattern of active regions 12a to 12i and field oxide region 13. The active regions 12a to 12i are isolated from each other by the field oxide region 13. FIG. 5 is a plan view showing a pattern of FIG. 4 formed on the main surface of the silicon substrate 28 of FIG. 3.

Figure 6:
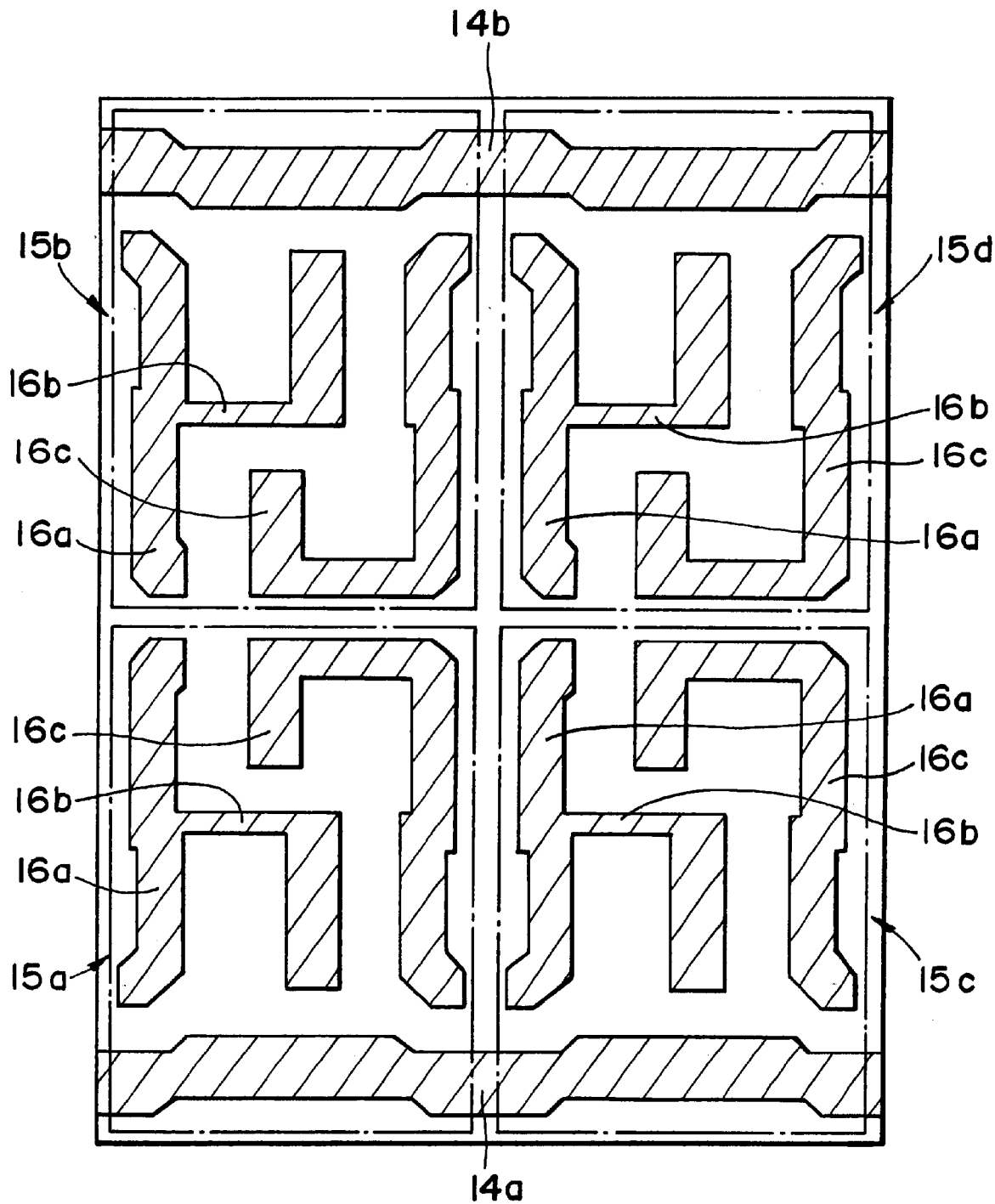
FIG. 6 is a plan view showing a pattern of word lines, a first conductive layer, second conductive layer, and third conductive layer in a memory cell formation region of the SRAM according to the first embodiment of the present invention.

FIG. 6 is a plan view showing a pattern of word lines 14a and 14b, first conductive layer 16a, second conductive layer 16b, and third conductive layer 16c in each of four memory cell formation regions 15a–15d. The word lines 14a and 14b, the first conductive layer 16a, the second conductive layer 16b, and the third conductive layer 16c are formed of polysilicon, for example. The first conductive layer 16a is in the shape of an "h" in combination with the second conductive layer 16b. The third conductive layer 16c is in the shape of a "7".

The pattern of the first conductive layer 16a, second conductive layer 16b, and third conductive layer 16c in the memory cell formation region 15a is a mirror image of the pattern of the first conductive layer 16a, second conductive layer 16b and third conductive layer 16c of the memory cell formation region 15b. The pattern of the first conductive layer 16a, second conductive layer 16b, and third conductive layer 16c in the memory cell formation region 15c is a mirror image of the pattern of the first conductive layer 16a, second conductive layer 16b, and third conductive layer 16c in the memory cell formation region 15d.

Figure 7:
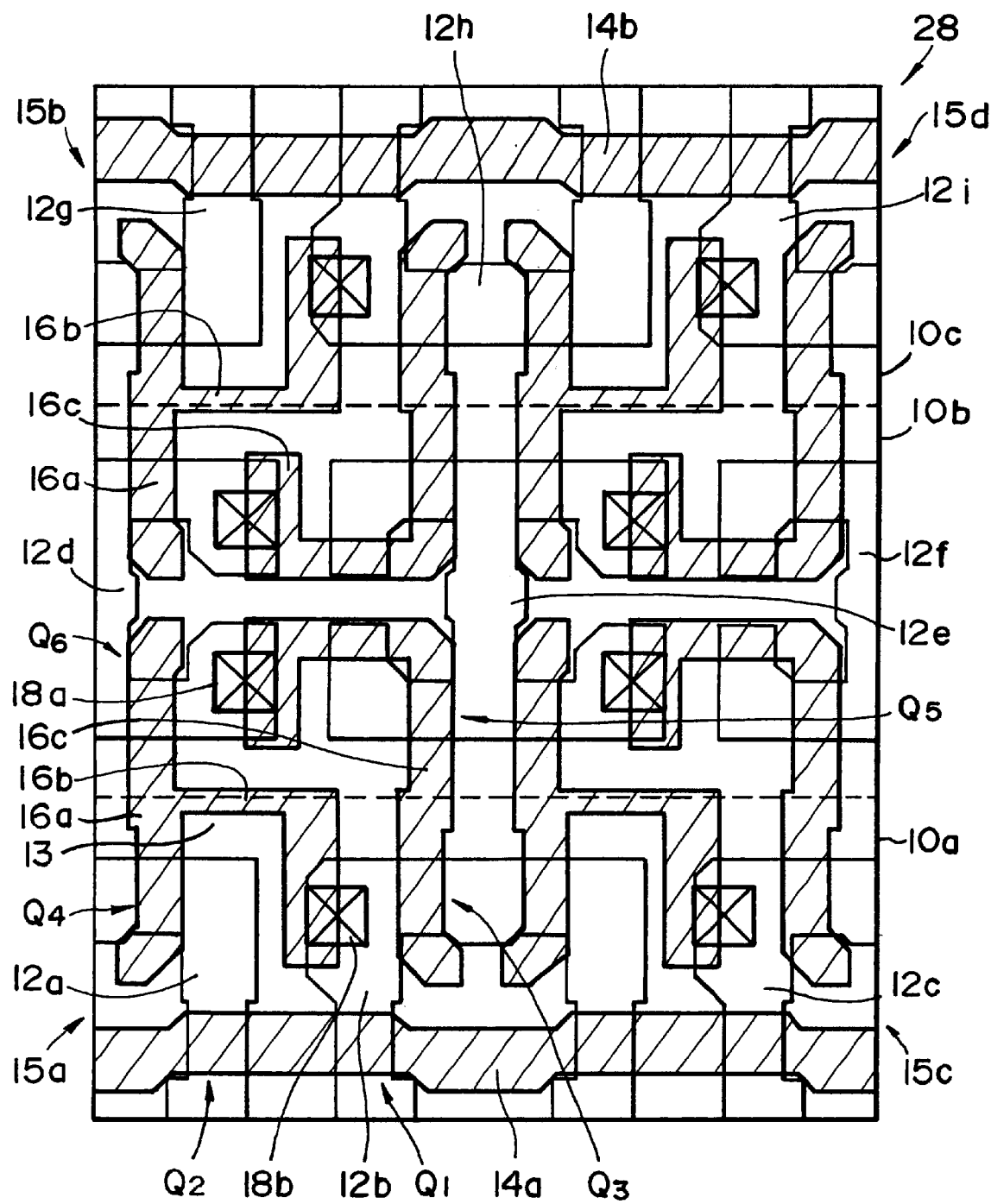
FIG. 7 is a plan view showing a pattern of word lines, a first conductive layer, second conductive layer, and third conductive layer of a memory cell formation region formed on the main surface of a silicon substrate used in the SRAM according to the first embodiment of the present invention.

FIG. 7 is a plan view showing a pattern of FIG. 6 formed on the main surface of the silicon substrate 28 of FIG. 5. Focusing on the memory cell formation region 15a, configuration of the first through third conductive layers and the word lines to the active region will be described. The first conductive layer 16a extends from an area on the active region 12d to an area on the active region 12a to be a gate electrode for a load transistor $Q_6$ and a driver transistor $Q_4$.

The second conductive layer 16b branches from the first conductive layer 16a in the field oxide region 13 and is electrically connected to the active region 12b through a contact hole 18b. The width of the second conductive layer 16b on the field oxide region 13 is smaller than the width of the first conductive layer 16a.

The third conductive layer 16c is electrically connected to the active region 12d through a contact hole 18a, passes across the active region 12e, and extends to an area on the active region 12b. The third conductive layer 16c is a gate electrode for a load transistor $Q_5$ and a driver transistor $Q_3$.

The word line 14a extends from an area on the active region 12a to an area on the active region 12b to be a gate electrode for transfer transistors $Q_2$ and $Q_1$. Configuration of the first through third conductive layers and the word lines to each active region in the memory cell formation regions 15b to 15d are the same as in the case of the memory cell formation region 15a. Therefore description thereof is omitted.

FIG. 1 is a plan view showing source and drain regions formed in each of the active regions 12a to 12i on the main surface of the silicon substrate 28 shown in FIG. 7 using the word lines 14a and 14b, the first conductive layer 16a, the second conductive layer 16b, and the third conductive layer 16c as masks. The hatched areas in the active regions 12a to 12i are the source and drain regions. Each source region and drain region in the active regions 12a to 12c and 12g to 12i are n-type, and each source region and drain region of the active regions 12d to 12f are p-type.

The first through third conductive layers, word lines, and contact holes are formed as follows. After the structure shown in FIG. 5 is formed, a conductive layer of polysilicon or the like is formed to cover the main surface of the silicon substrate. The conductive layer is then patterned to form the first through third conductive layers and the word lines. Using the first through third conductive layers and the word lines as masks, an ion implantation is performed on the main surface of the silicon substrate to form source and drain regions. An insulating layer of a silicon oxide film or the like is formed to cover the main surface of the silicon substrate. Contact holes for electrically connecting the second conductive layer to the second driver transistor active region and contact holes for electrically connecting the third conductive layer to the first load transistor active region are formed in the insulating layer.

The structure shown in FIG. 1 is as described above. Next, the structure shown in FIG. 16 will be described from the lowest layer with reference to FIGS. 8 to 15.

Figure 8:
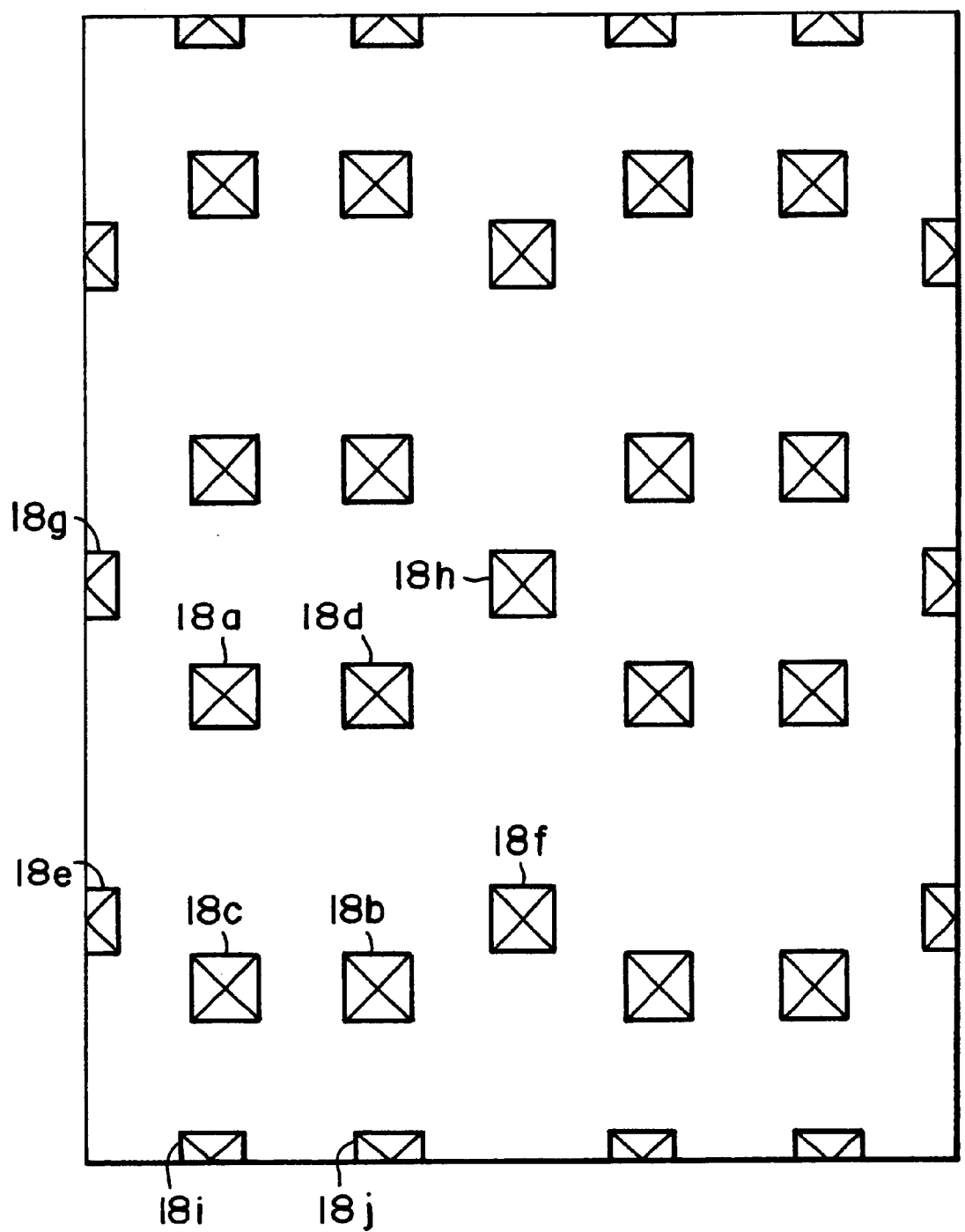
FIG. 8 is a plan view showing a pattern of contact holes of the SRAM according to the first embodiment of the present invention.
Figure 9:
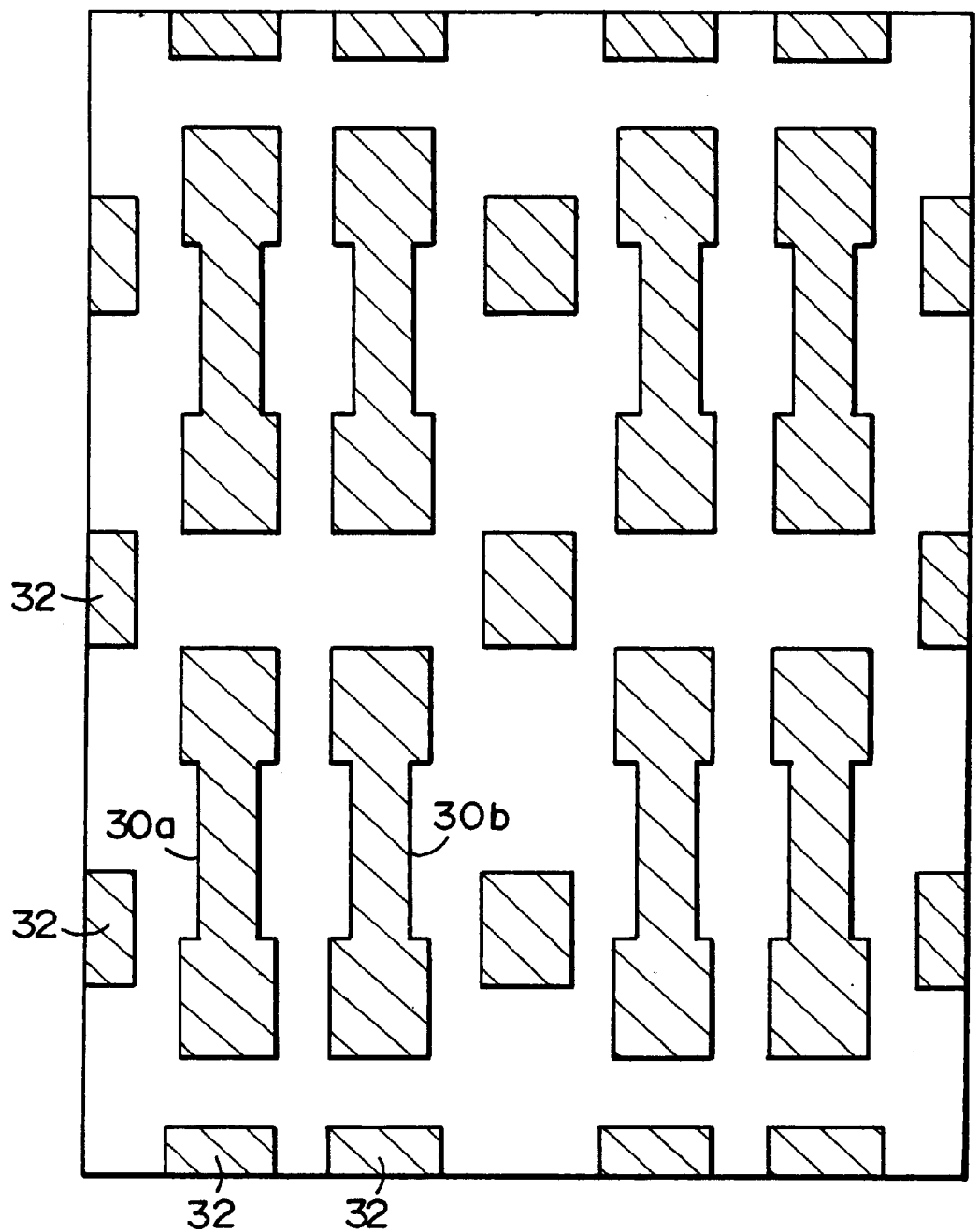
FIG. 9 is a plan view showing a pattern of drain connecting wirings and contact pads of the SRAM according to the first embodiment of the present invention.
Figure 10:
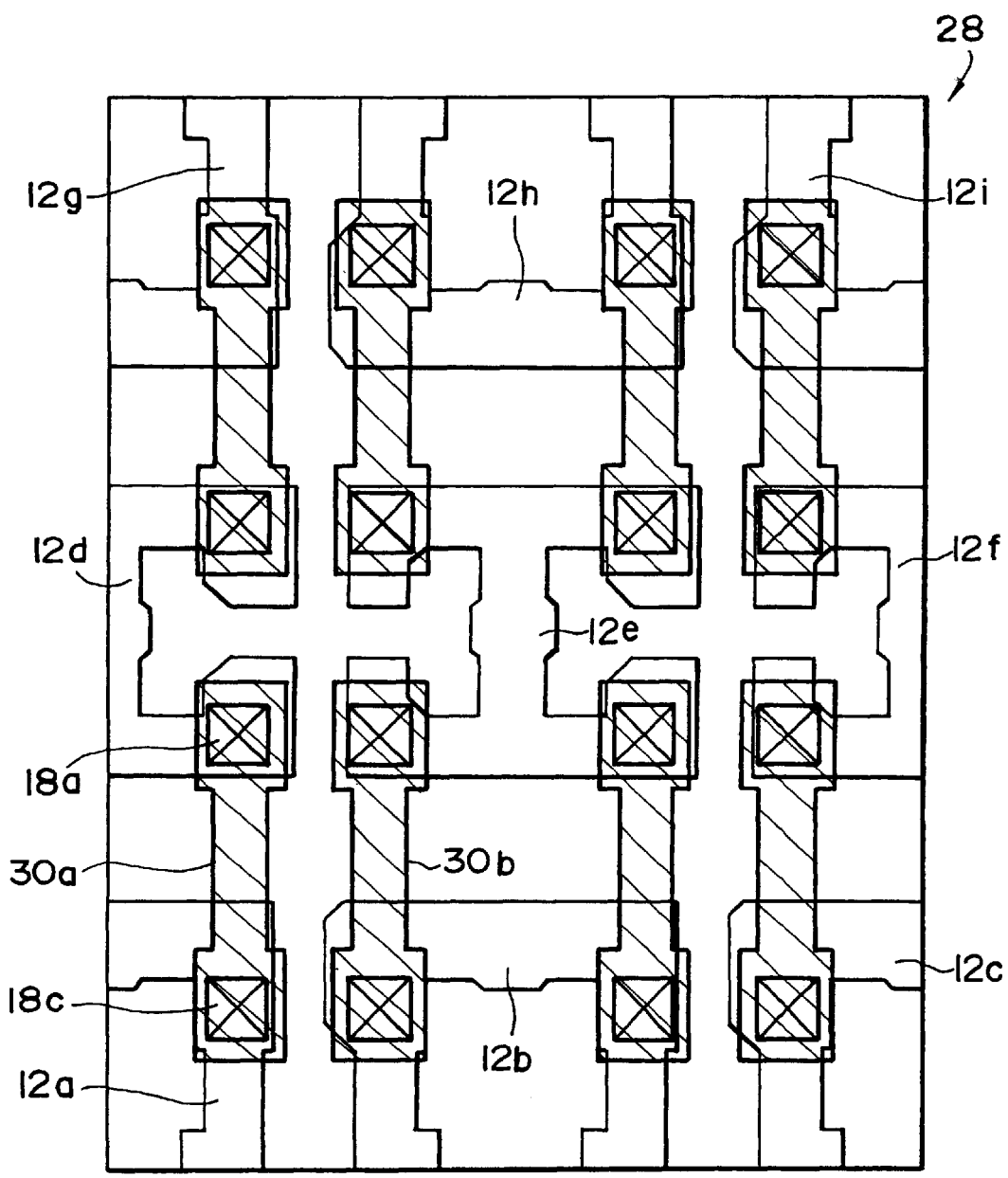
FIG. 10 is a plan view showing a pattern of the drain connecting wirings formed on the main surface of a silicon substrate used in the SRAM according to the first embodiment of the present invention.

FIG. 8 is a plan view showing a pattern of contact holes 18a to 18j. FIG. 9 is a plan view showing a pattern of local wirings comprising drain connecting wirings 30a and 30b and contact pads 32. FIG. 10 is a plan view showing the pattern shown in FIGS. 8 and 9 formed on the main surface of the silicon substrate 28 of FIG. 1. Note that the components of FIG. 1 other than the active regions 12a to 12i are omitted. The hatching for each source region and drain region in the active regions 12a to 12i is omitted. Part of the contact holes shown in FIG. 8 and part of the contact pads 32 shown in FIG. 9 are omitted.

As shown in FIG. 10, the drain connecting wirings electrically connect the drain regions in the active region to each other. For example, the drain connecting wiring 30a is electrically connected to the drain region of the active region 12a through the contact hole 18c and also connected to the drain region of the active region 12d through the contact hole 18a.

Figure 11:
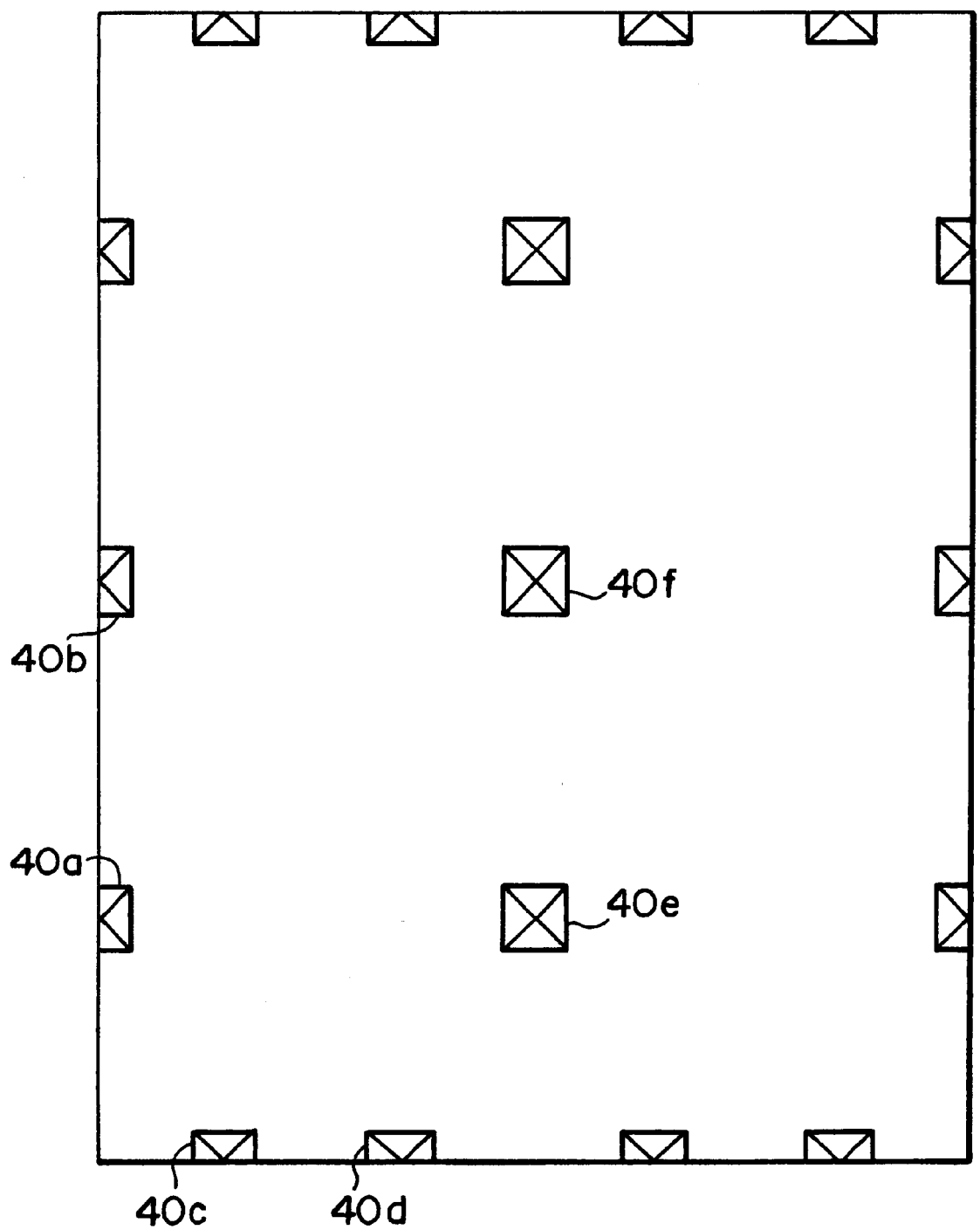
FIG. 11 is a plan view showing a pattern of contact holes of the SRAM according to the first embodiment of the present invention.
Figure 12:
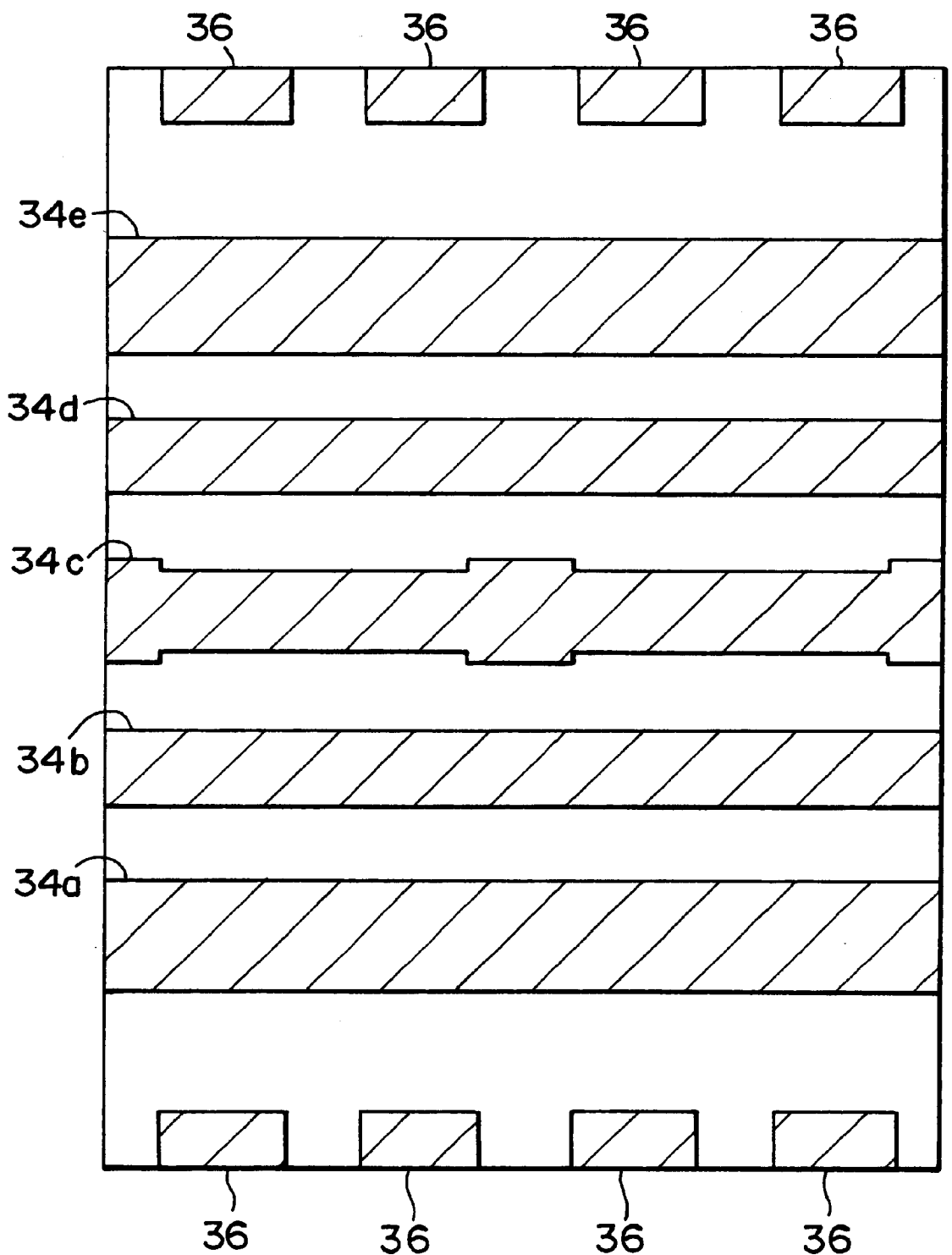
FIG. 12 is a plan view showing a pattern of wirings and contact pads of the SRAM according to the first embodiment of the present invention.
Figure 13:
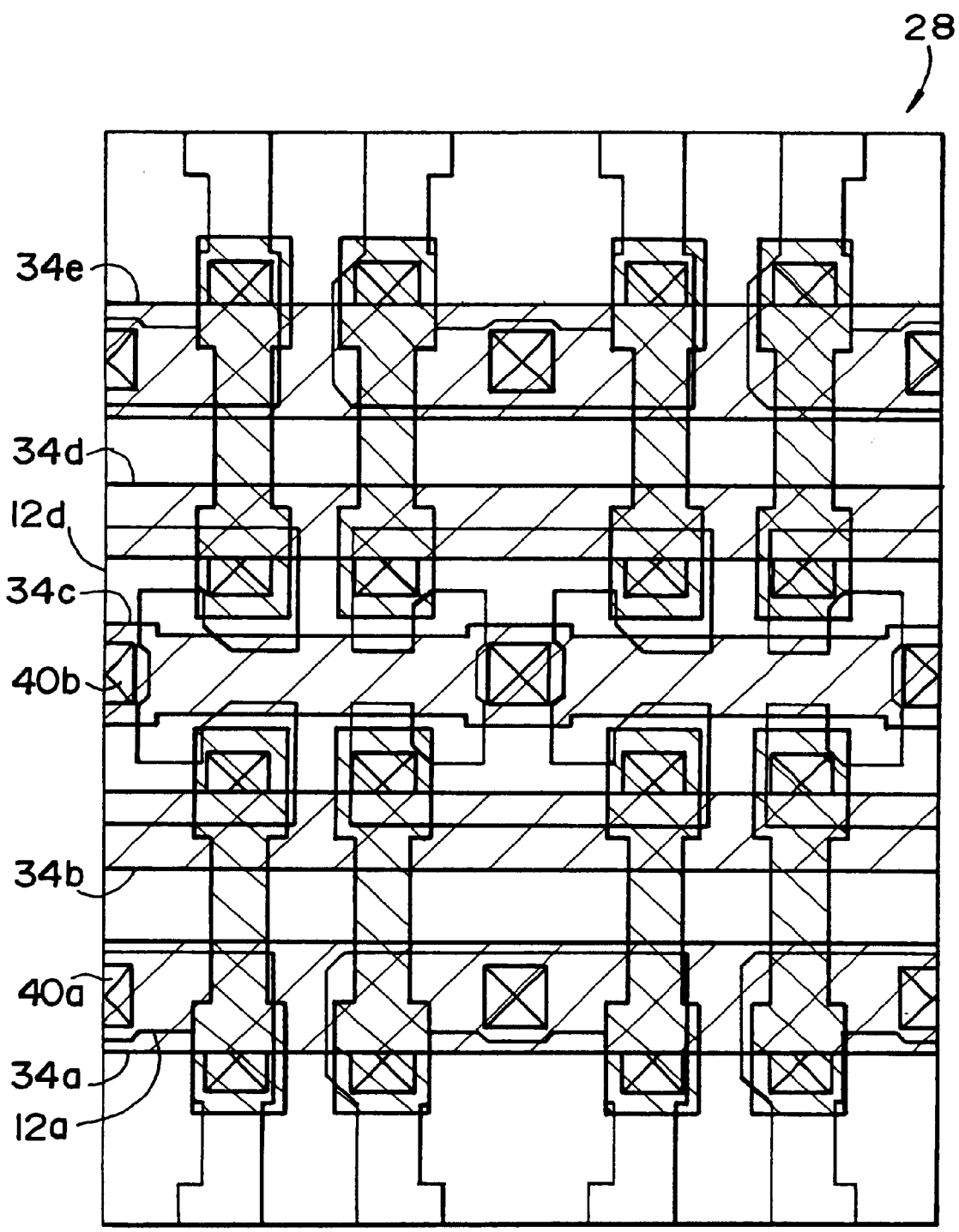
FIG. 13 is a plan view showing part of a pattern of wirings formed on the main surface of a silicon substrate used in the SRAM according to the first embodiment of the present invention.

FIG. 11 is a plan view showing a pattern of contact holes 40a to 40f. FIG. 12 is a plan view showing a pattern of a wiring layer comprising wirings 34a to 34e and contact pads 36. For example, the wirings 34a to 34e and the contact pads 36 are made of aluminum or aluminum alloys comprising aluminum and copper or the like. FIG. 13 is a plan view showing the pattern shown in FIGS. 11 and 12 formed on the main surface of the silicon substrate 28 of FIG. 10. Note that the contact holes 40c and 40d shown in FIG. 11 and the contact pads 36 shown in FIG. 12 are omitted.

These wirings 34a to 34e are electrically connected to the source regions in the active regions. For example, the wiring 34a is electrically connected to the source region in the active region 12a at a contact section 40a through the contact pad 32 (not shown). The wiring 34a is electrically connected to a grounding conductor $V_{SS}$. The wiring 34c is electrically connected to the source region of the active region 12d at a contact section 40b through the contact pad 32 (not shown). The wiring 34c is electrically connected to a power source $V_{DD}$.

Figure 14:
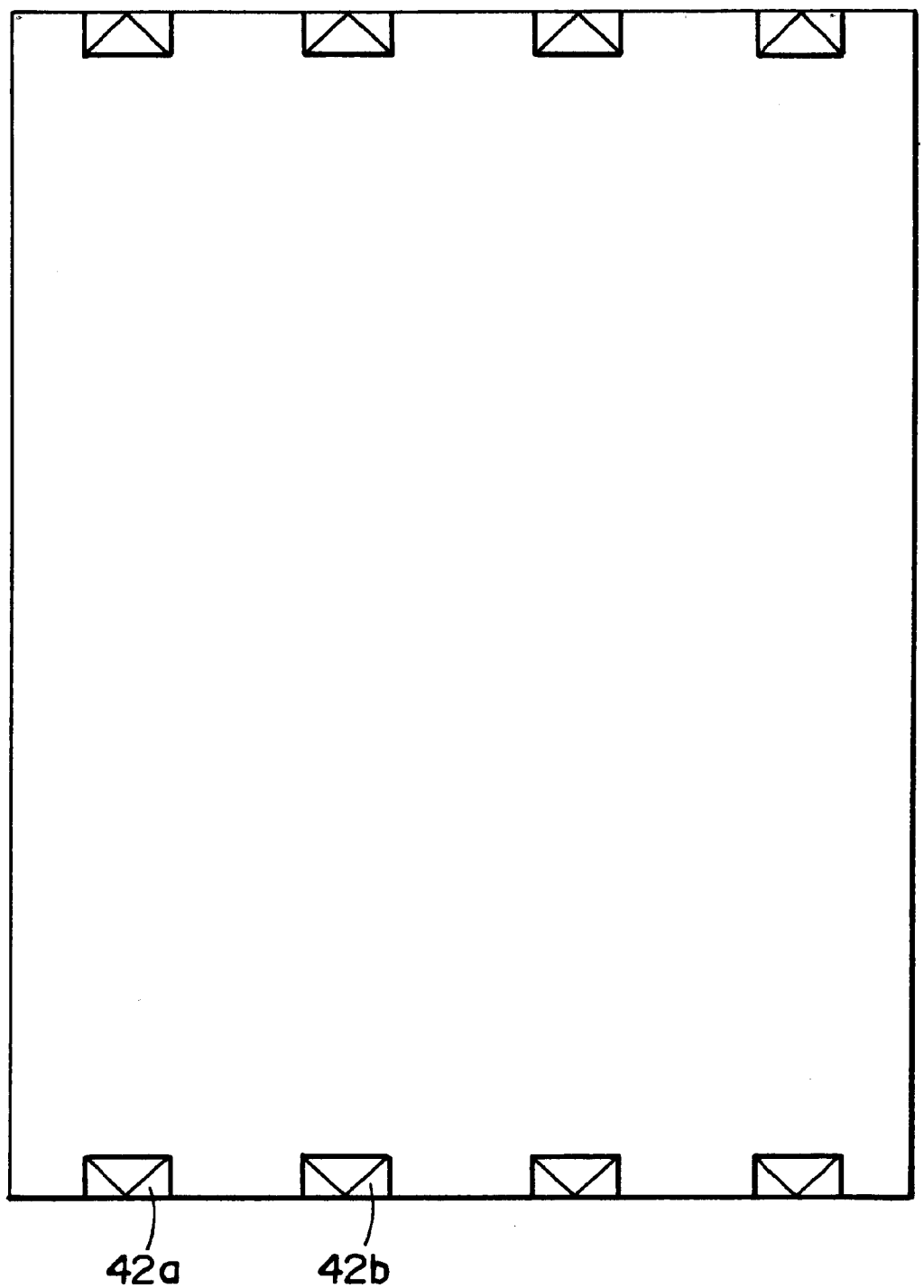
FIG. 14 is a plan view showing a pattern of via-holes of the SRAM according to the first embodiment of the present invention.
Figure 15:
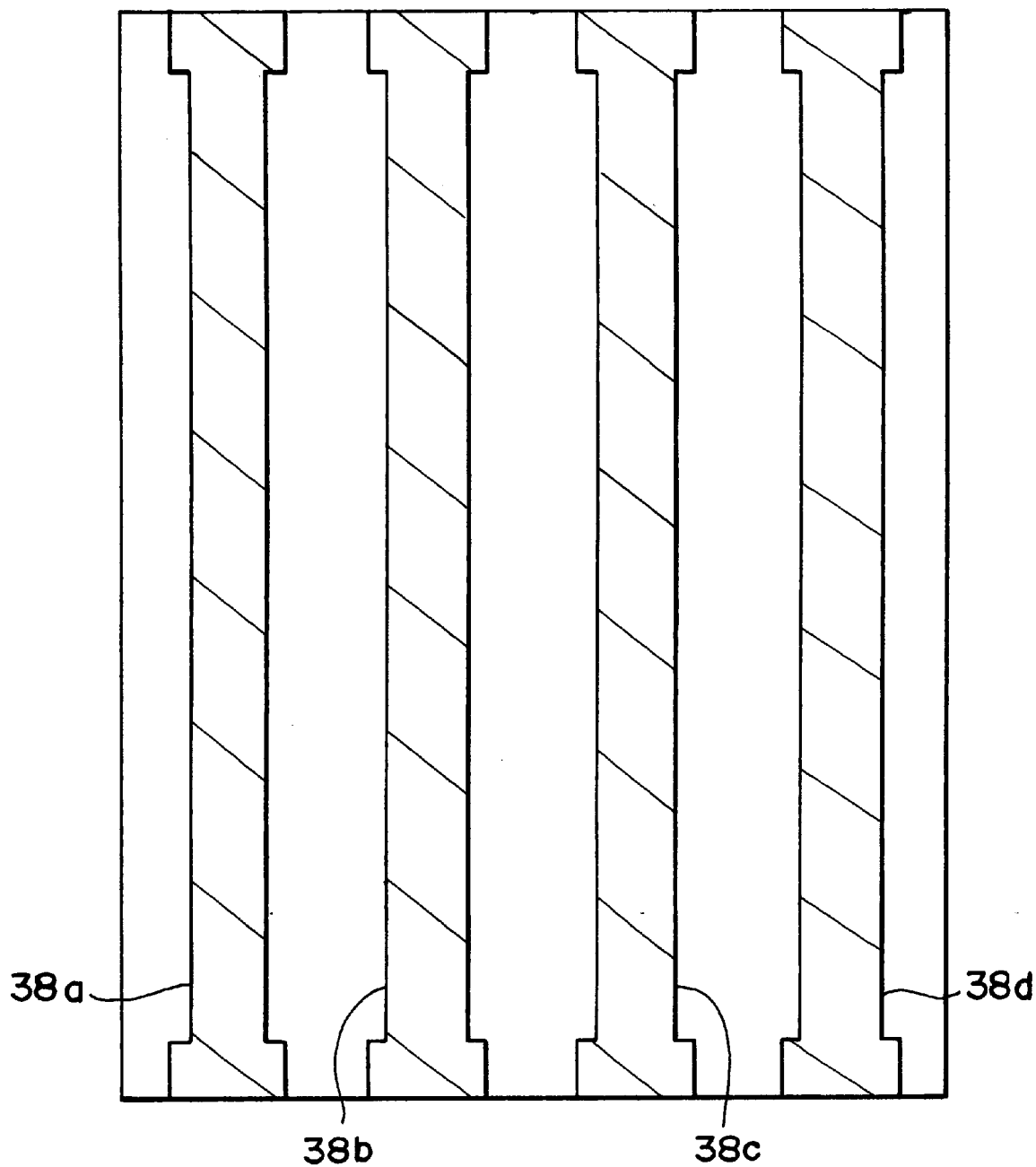
FIG. 15 is a plan view showing a pattern of bit lines of the SRAM according to the first embodiment of the present invention.

FIG. 14 is a plan view showing a pattern of via-holes 42a and 42b. FIG. 15 is a plan view showing a pattern of bit lines 38a to 38d. For example, the bit lines 38a to 38d are made of aluminum or aluminum alloys comprising aluminum and copper or the like.

FIG. 16 is a plan view showing the pattern shown in FIGS. 14 and 15 formed on the main surface of the silicon substrate 28 shown in FIG. 13. These bit lines 38a to 38d are electrically connected to each corresponding active region. For example, the bit line 38a is electrically connected to the active region 12a through the via-hole 42a, contact pad 36 (not shown), contact hole 40c, contact pad 32, and contact hole 18i.

Description of Equivalent Circuit

Figure 17:
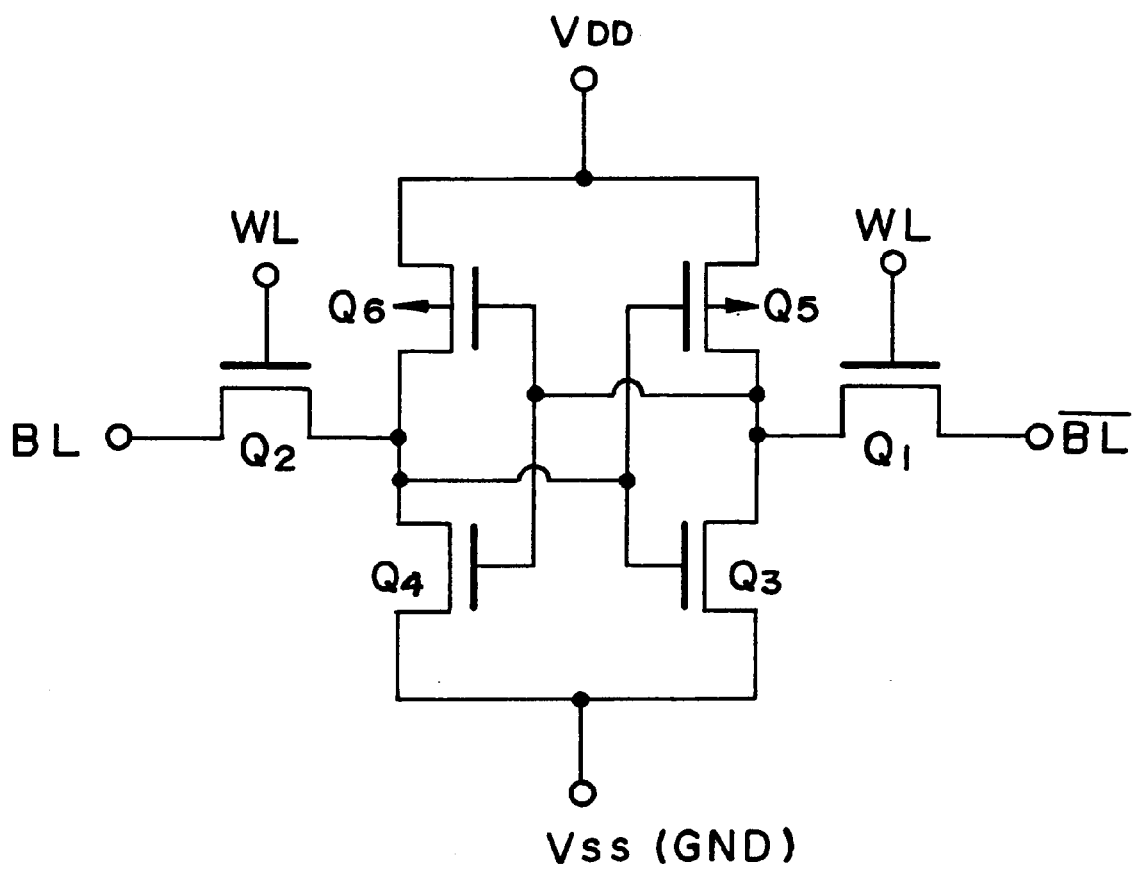
FIG. 17 is an equivalent circuit diagram of the SRAM according to the first embodiment of the present invention.

FIG. 17 is an equivalent circuit diagram of the memory cell of the SRAM shown in FIGS. 1 and 16. A load transistor $Q_5$ and a driver transistor $Q_3$ constitute an inverter and a load transistor $Q_6$ and a driver transistor $Q_4$ constitute the other inverter. These inverters are electrically connected to each other to form a flip-flop.

The source/drain of a transfer transistor $Q_2$ is electrically connected to the output of the inverter consisting of the load transistor $Q_6$ and the driver transistor $Q_4$ and to a bit line BL. A gate electrode of the transfer transistor $Q_2$ is electrically connected to a word line WL.

Sources of the load transistors $Q_5$ and $Q_6$ are electrically connected to the power source $V_{DD}$. Sources of the driver transistors $Q_3$ and $Q_4$ are electrically connected to the grounding conductor $V_{SS}$.

The source/drain of a transfer transistor $Q_1$ is electrically connected to the output of the inverter consisting of the load transistor $Q_5$ and driver transistor $Q_3$ and to a bit line (/BL). A gate electrode of the transfer transistor $Q_1$ is electrically connected to a word line WL.

Description of Sectional Structure

Figure 18:
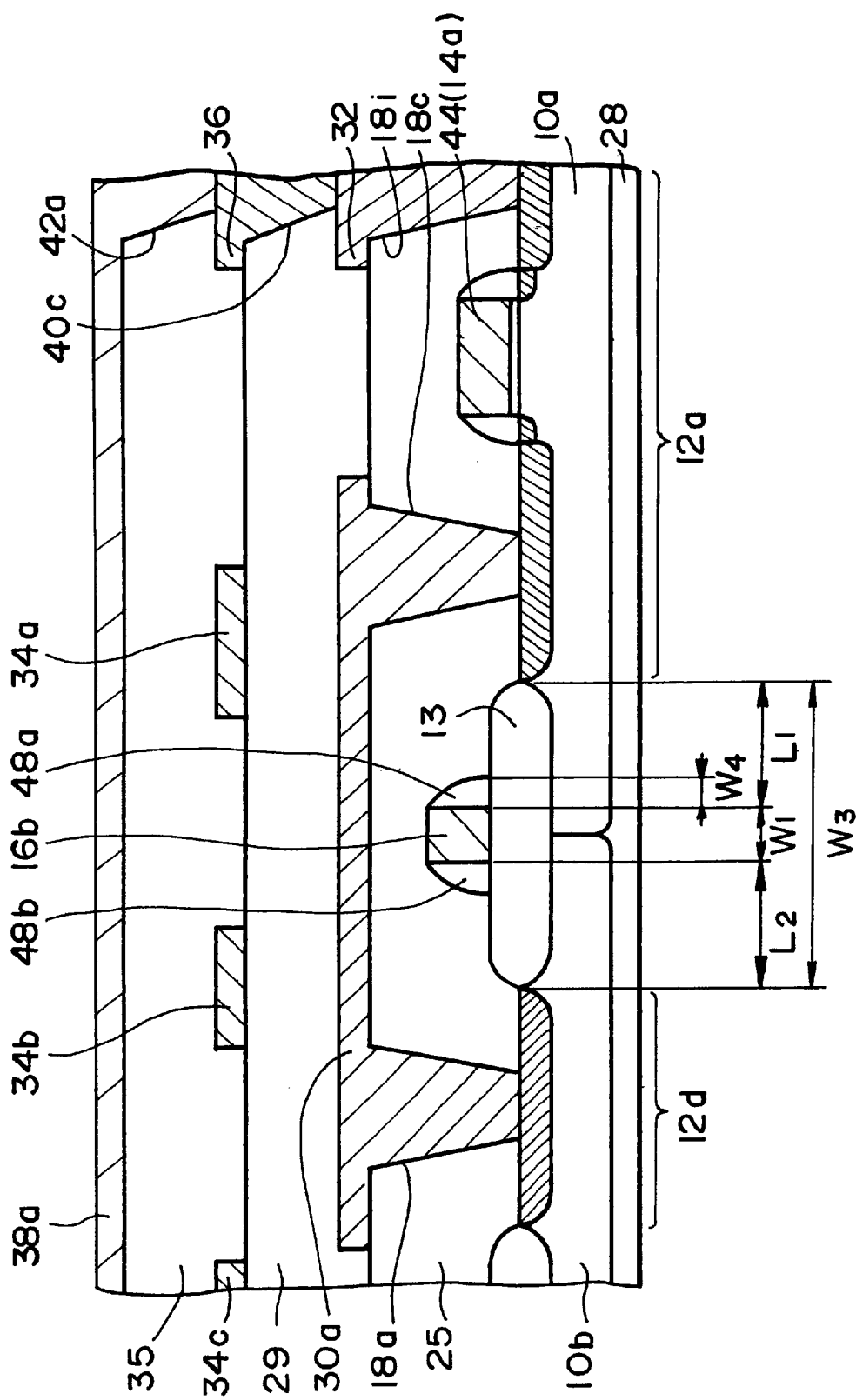
FIG. 18 is a cross section of the memory cell of the SRAM shown in FIGS. 1 and 16 taken along the A—A line.

FIG. 18 is a cross section of the memory cell of the SRAM shown in FIGS. 1 and 16 taken along the A—A line.

The p-type well 10a and the n-type well 10b are formed on the main surface of the silicon substrate 28. The active region 12a is formed on the p-type well 10a, and the active region 12d is formed on the n-type well 10b. The active region 12a is isolated from the active region 12d by the field oxide region 13 that is a field oxide film.

A gate electrode 44 is formed on the active region 12a. The gate electrode 44 is a part of the word line 14a of the transfer transistor $Q_2$ shown in FIG. 1. The second conductive layer 16b is formed on the field oxide region 13. Side wall insulating films 48a and 48b are formed on the sides of the second conductive layer 16b.

An interlayer dielectric 25 formed of a silicon oxide film or the like is formed on the main surface of the silicon substrate 28 to cover the gate electrode 44, the second conductive layer 16b, and the like. The contact holes 18a, 18c, and 18i are formed in the interlayer dielectric 25. The contact hole 18i exposes the source/drain region in the active region 12a, the contact hole 18c exposes the drain region in the active region 12a, and the contact hole 18a exposes the drain region in the active region 12d.

The drain connecting wiring 30a and the contact pad 32 are formed on the interlayer dielectric 25. An end of the drain connecting wiring 30a is electrically connected to the drain region in the active region 12a via the contact hole 18c. The other end of the drain connecting wiring 30a is electrically connected to the drain region in the active region 12d via the contact hole 18a. The contact pad 32 is electrically connected to the source/drain region in the active region 12a via the contact hole 18i.

An interlayer dielectric 29 formed of a silicon oxide film or the like is formed to cover the drain connecting wiring 30a and the contact pad 32.

Wirings 34a, 34b, and 34c and contact pad 36 are formed on the interlayer dielectric 29. A contact hole 40c is formed in the interlayer dielectric 29 to expose the contact pad 32. The contact pad 36 is electrically connected to the contact pad 32 via the contact hole 40c.

An interlayer dielectric 35 formed of a silicon oxide film or the like is formed to cover the wirings 34a, 34b, and 34c and the contact pad 36. A contact hole 42a is formed in the interlayer dielectric 35 to expose the contact pad 36.

A bit line 38a is formed on the interlayer dielectric 35. The bit line 38a is electrically connected to the contact pad 36 via the contact hole 42a. Accordingly, the bit line 38a is electrically connected to the source/drain region in the active region 12a via the contact holes 42a, 40c, and 18i.

Description of Effect

Effect 1

As shown in FIG. 1, in the first embodiment, the width $W_1$ of the second conductive layer 16b on the field oxide region 13 is less than the width $W_2$ of the first conductive layer 16a. Because of this, the width $W_3$ of the field oxide region 13 can be reduced even if a mask alignment error is taken into account when forming the first through third conductive layers without causing an imbalance in the β ratio of the memory cell. As described above, the first embodiment can realize the miniaturization of the memory cell without causing an imbalance in the β ratio of the memory cell.

Effect 2

As shown in FIG. 18, in the first embodiment, the distance L1 between the second conductive layer 16b on the field oxide region 13 and the active region 12a is larger than the sum of the value Ae of an alignment error at the time of forming the pattern of the first through third conductive layers and the width $W_4$ of the side wall insulating film 48a. For example, when $L_1$ is 0.25 μm, Ae is 0.1 μm, and $W_4$ is 0.1 μm.

The above structure reliably prevents the second conductive layer 16b and the side wall insulating film 48a from being positioned on the active region 12a. If the second conductive layer 16b and the side wall insulating film 48a are positioned on the active region 12a, the gate width of the driver transistor $Q_4$ shown in FIG. 1 becomes smaller than the designed value. This causes an imbalance in the β ratio of the memory cell to cause the characteristics of the SRAM to deteriorate.

Effect 3

Figure 19:
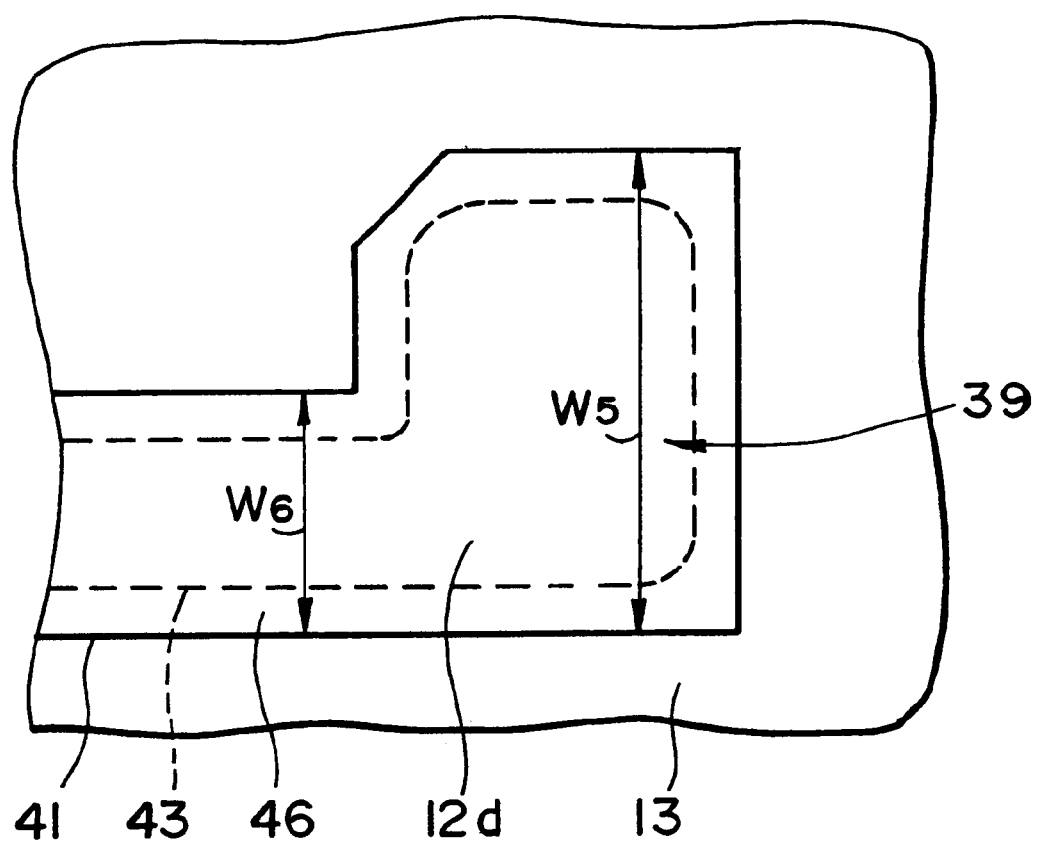
FIG. 19 is a plan view showing an end section of the active region shown in FIG. 1.

FIG. 19 shows an end section 39 of the active region 12d shown in FIG. 1. The drain connecting wiring 30a shown in FIG. 18 and the third conductive layer 16c shown in FIG. 1 are electrically connected to the end section 39.

The active region 12d is designed to be the region indicated by the solid line 41 but actually becomes the region indicated by the broken line 43 due to a bird's beak 46.

In the first embodiment, the width $W_5$ of the end section 39 is larger than the width $W_6$ of the other section of the active region. This makes it possible to increase the area of the end section 39. Accordingly, the area of the end section 39 is large enough to allow good contact with the drain connecting wiring 30a and the third conductive layer 16c, even if the bird's beak 46 is formed.

Second Embodiment

Figure 20:
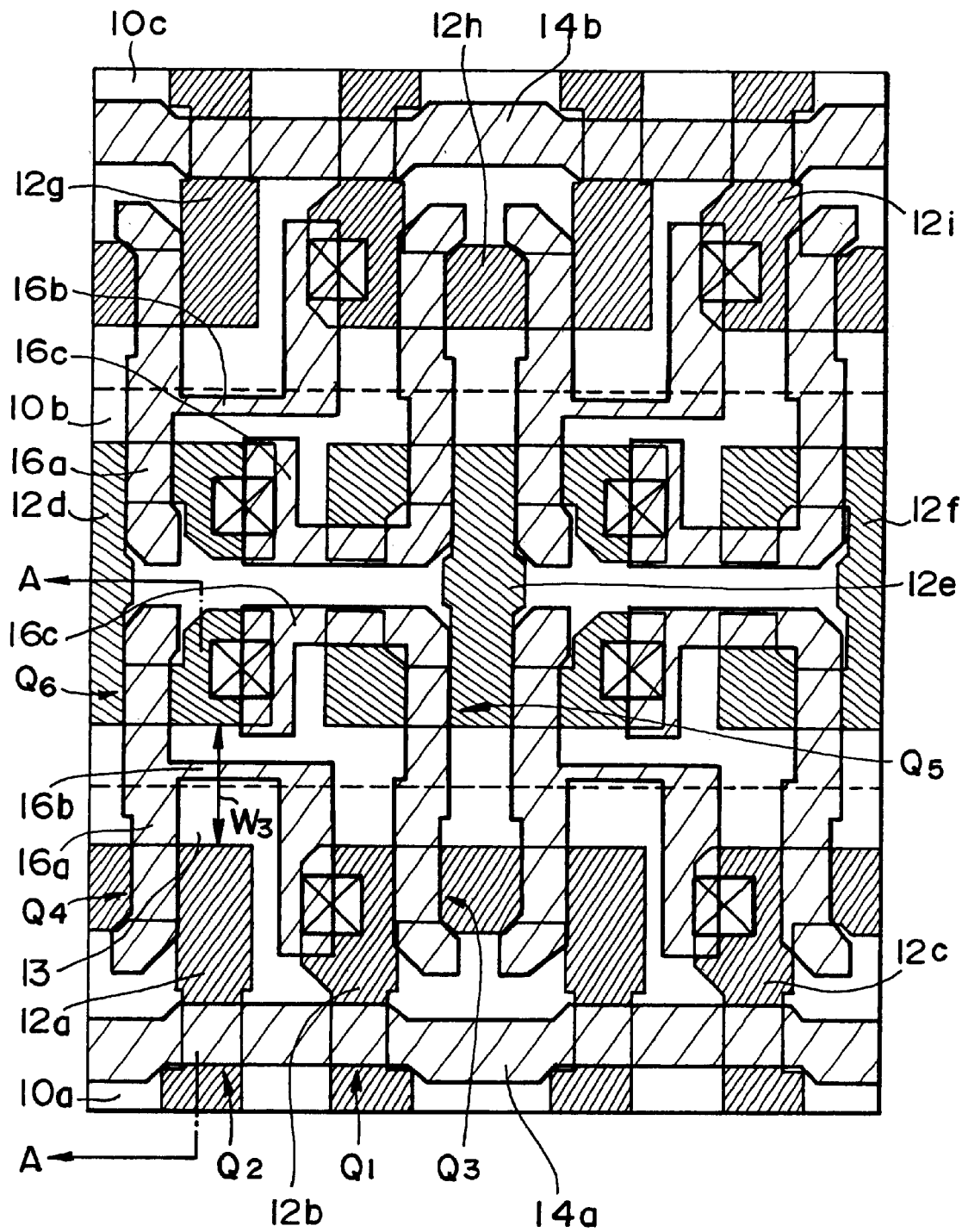
FIG. 20 is a plan view showing part of an element formation layer of a memory cell array of an SRAM according to a second embodiment of the present invention.
Figure 21:
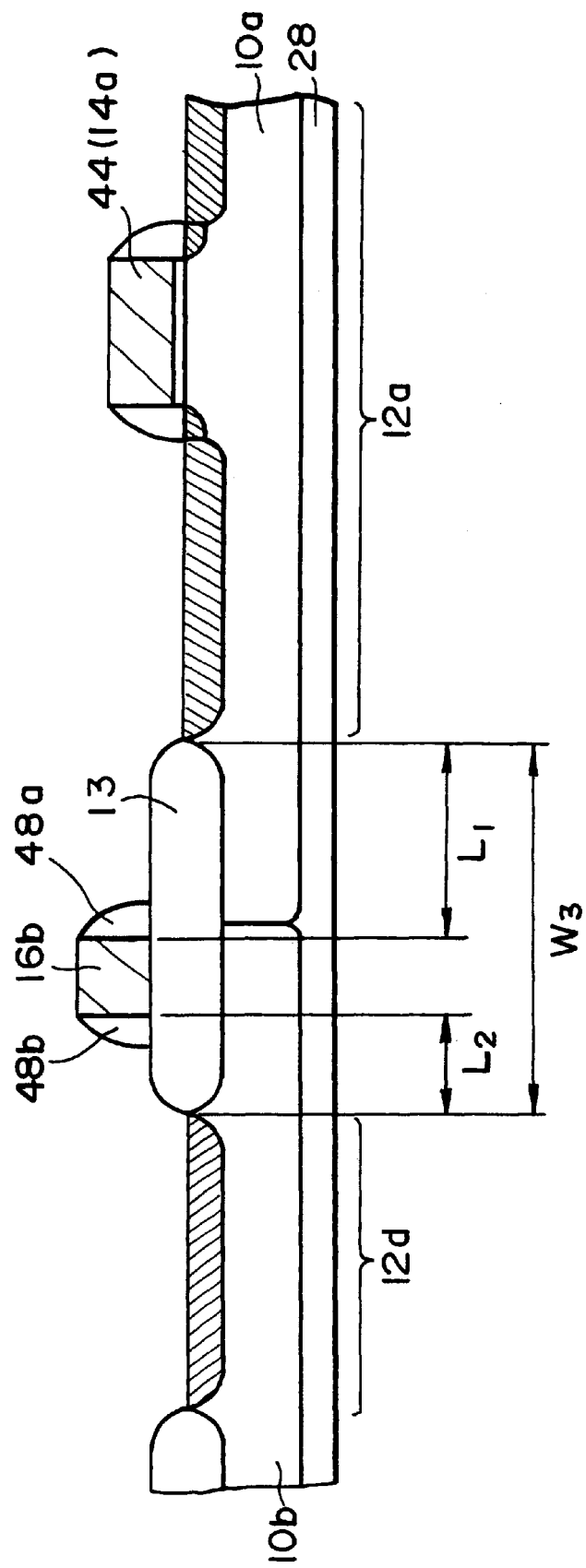
FIG. 21 is a cross section of a memory cell of the SRAM shown in FIG. 20 taken along the A—A line.

FIG. 20 is a plan view showing part of an element formation layer of a memory cell array of an SRAM according to a second embodiment of the present invention. FIG. 21 is a cross section of a memory cell of the SRAM shown in FIG. 20 taken along the A—A line.

The position of the second conductive layer 16b is the only difference between the second embodiment from the first embodiment. Since the structure other than this is the same as in the first embodiment, further description is omitted by using the same symbols.

As shown FIG. 18, in the first embodiment, the distance $L_2$ between the second conductive layer 16b and the active region 12d is as same as the distance $L_1$ between the second conductive layer 16b and the active region 12a.

On the contrary, in the second embodiment, the distance $L_2$ between the second conductive layer 16b and the active region 12d is less than the distance $L_1$ between the second conductive layer 16b and the active region 12a as shown in FIG. 21.

Even if the second conductive layer 16b and the side wall insulating film 48b are positioned on the active region 12d to cause the reduced gate width of the load transistor $Q_6$ shown in FIG. 20, the β ratio of a memory cell is not influenced. Accordingly, the distance $L_2$ between the second conductive layer 16b and the active region 12d can be less than the distance $L_1$ between the second conductive layer 16b and the active region 12a. Because of this, the width $W_3$ of the field oxide region 13 can be reduced resulting in the miniaturization of the memory cell.

The structure of the second embodiment is the same as that of the first embodiment except for the position of the second conductive layer 16b. Therefore, the effects 1–3 in the first embodiment are also obtained in the second embodiment.

Third Embodiment

Description of Planar Structure

Figure 22:
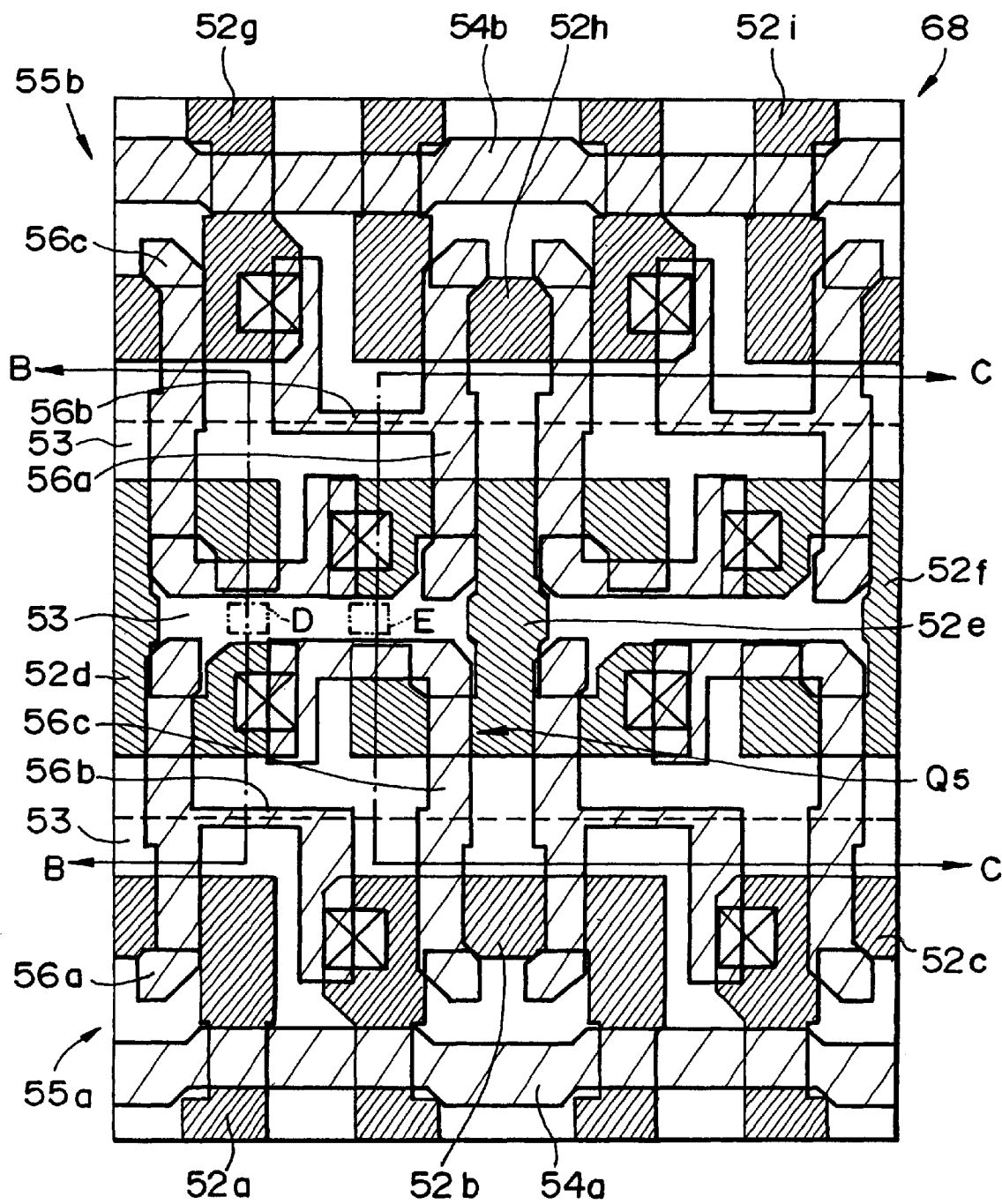
FIG. 22 is a plan view showing part of an element formation layer of a memory cell array of an SRAM according to a third embodiment of the present invention.

FIG. 22 is a plan view showing the element formation layer, or a part of a memory cell array of an SRAM according to a third embodiment of the present invention. The structure shown in FIG. 22 will be described from the lowest layer with reference to FIGS. 23 to 26.

Figure 23:
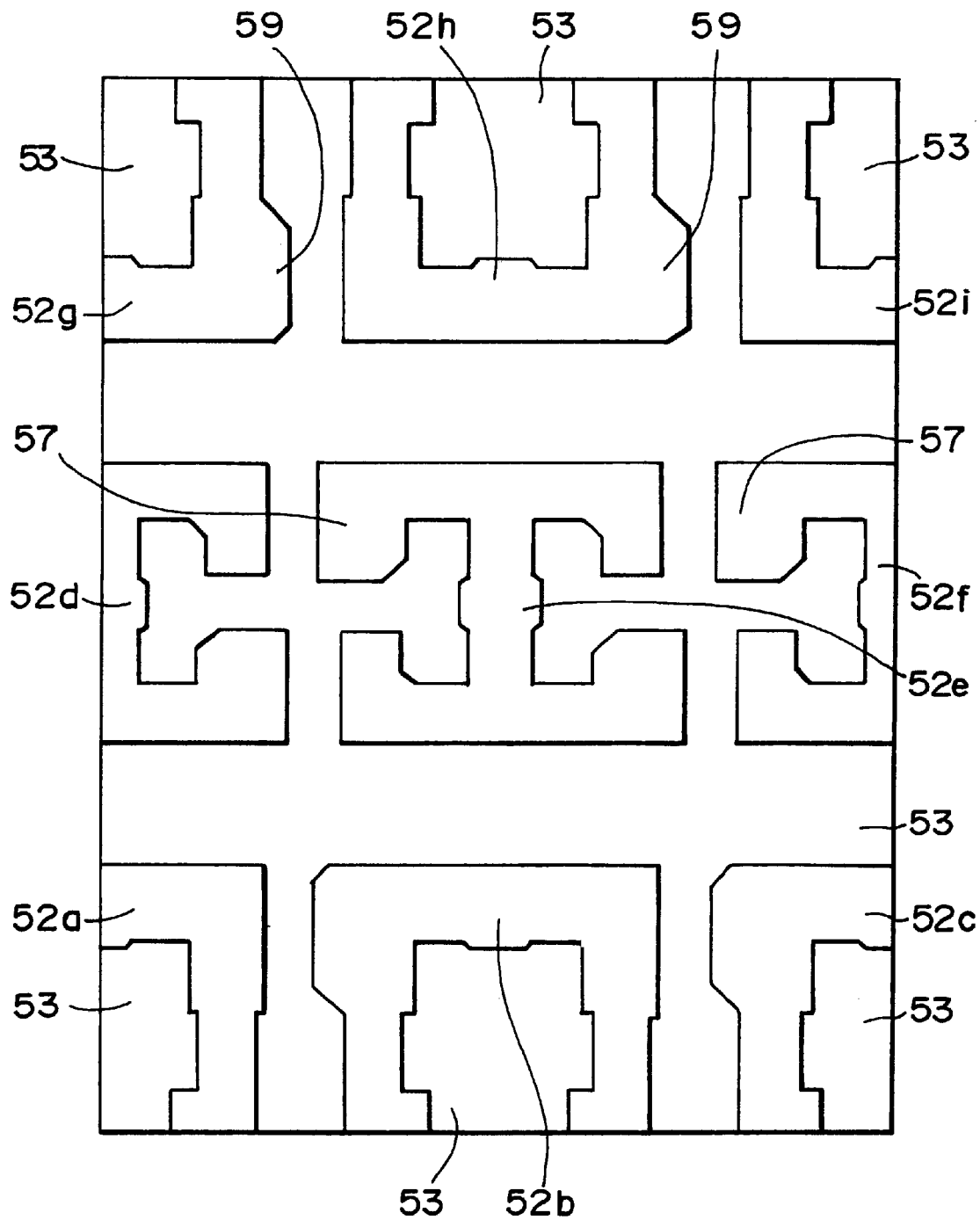
FIG. 23 is a plan view showing a pattern of an active region and a field oxide region of the SRAM according to the third embodiment of the present invention.

FIG. 23 is a plan view showing a pattern of active regions 52a to 52i and a field oxide region 53. The active regions 52a to 52i are isolated from each other by the field oxide region 53. A difference from the pattern shown in FIG. 4 is the forms of the active regions 52d to 52i. Specifically, the position of a contact region 57 with the third conductive layer and the position of a contact region 59 with the second conductive layer are different from those in FIG. 4.

Figure 24:
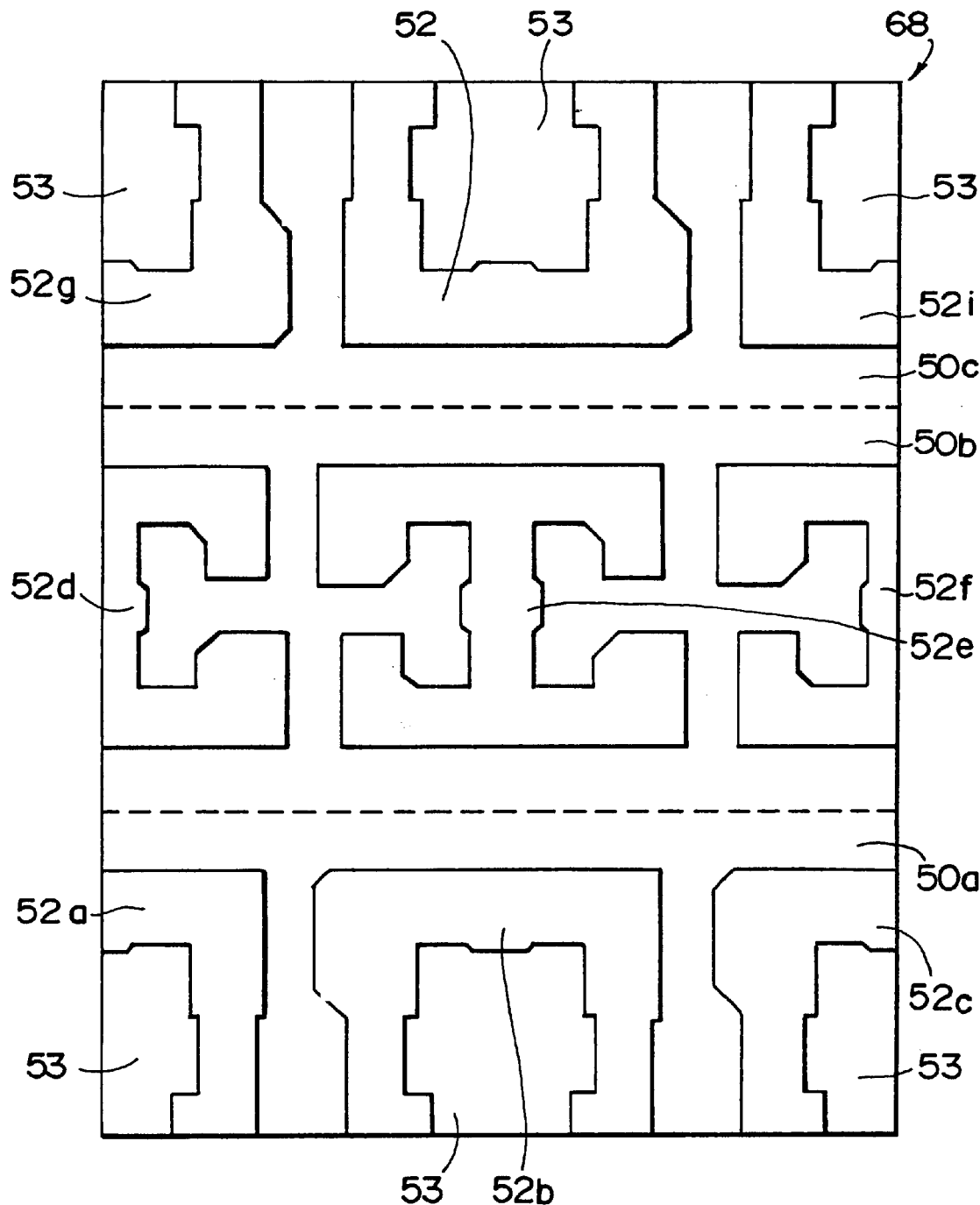
FIG. 24 is a plan view showing a pattern of the active region and a field oxide region formed on the main surface of a silicon substrate used in the SRAM according to the third embodiment of the present invention.

FIG. 24 is a plan view showing the pattern of FIG. 23 formed on the main surface of a silicon substrate 68 previously provided with the pattern of a p-type well 50a, n-type well 50b, and p-type well 50c.

Figure 25:
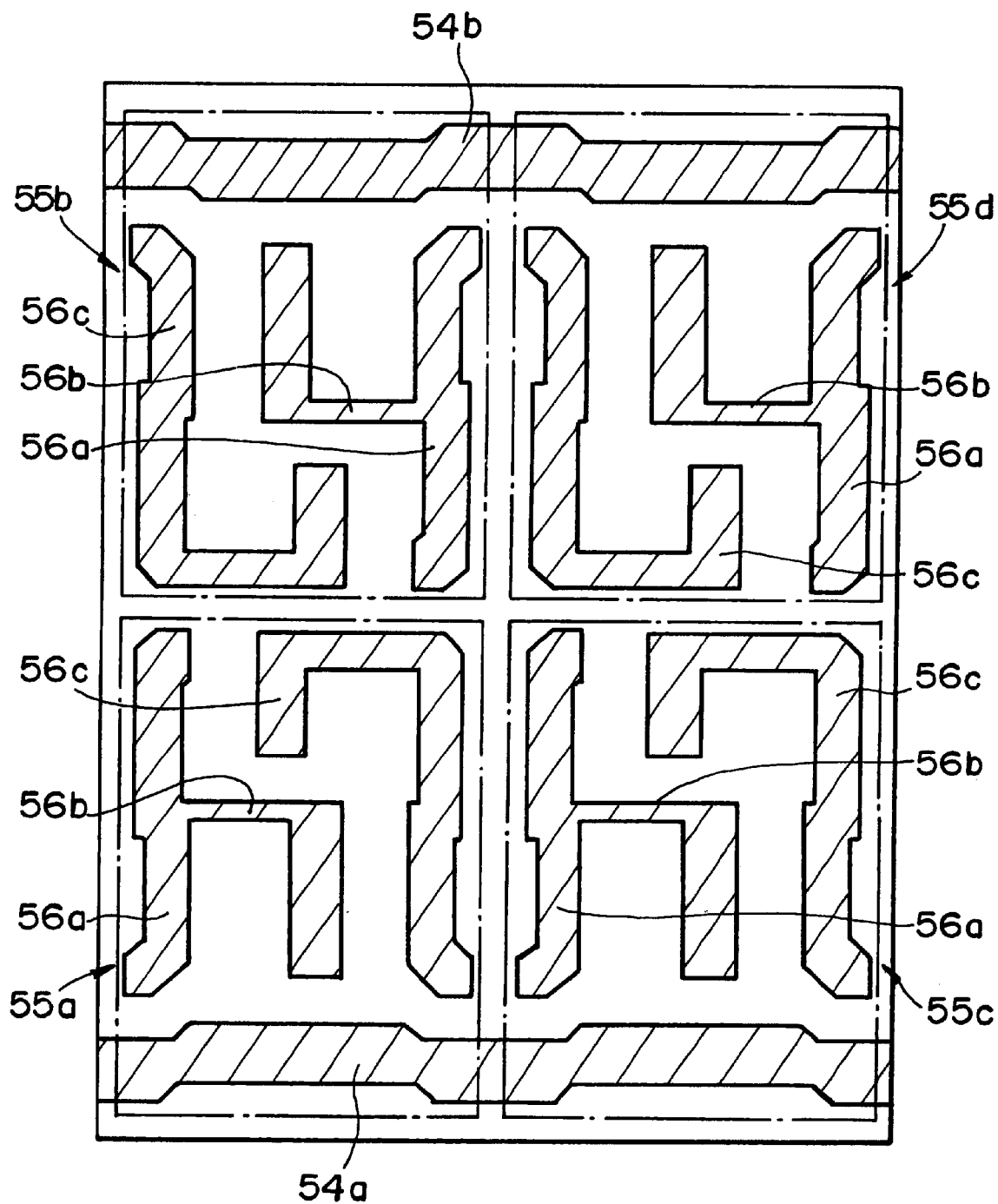
FIG. 25 is a plan view showing a pattern of word lines, a first conductive layer, second conductive layer, and third conductive layer in a memory cell formation region of the SRAM according to the third embodiment of the present invention.

FIG. 25 is a plan view showing a pattern of word lines 54a and 54b, a first conductive layer 56a, second conductive layer 56b, and third conductive layer 56c in each of memory cell formation regions 55a to 55d. The word lines 54a and 54b and the first through third conductive layers 56a to 56c are made of polysilicon, for example. The first conductive layer 56a and the second conductive layer 56b are arranged in a shape of an "h", and the third conductive layer 56c is in a shape of a "7".

The pattern of the first conductive layer 56a, second conductive layer 56b, and third conductive layer 56c of each of the memory cell formation regions 55b and 55d in the second line of the memory cell array is a pattern formed by rotating the pattern of the first conductive layer 56a, second conductive layer 56b, and third conductive layer 56c of the memory cell formation regions 55a and 55c in the first line of the memory cell array by 180 degrees around an axis perpendicular to the surface with the pattern formed thereon (the main surface of the silicon substrate 68).

Figure 26:
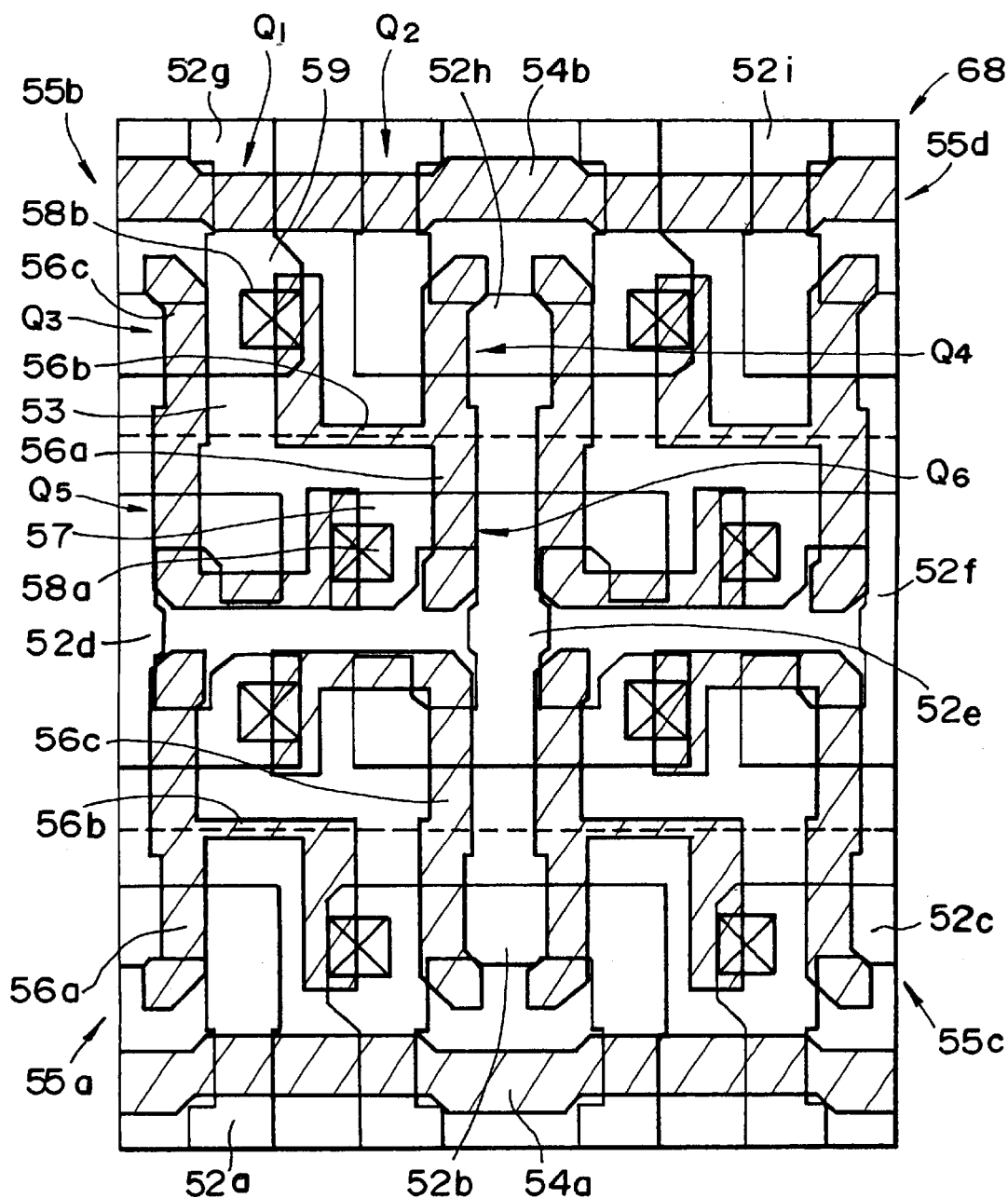
FIG. 26 is a plan view showing a pattern of word lines, a first conductive layer, second conductive layer and third conductive layer in a memory cell formation region formed on the main surface of a silicon substrate used in the SRAM according to the third embodiment of the present invention.

FIG. 26 is a plan view showing the pattern of FIG. 25 formed on the main surface of the silicon substrate 68 of FIG. 24. Configuration of the first through third conductive layers and the word lines to the active regions of the memory cell formation regions 55a and 55c is the same as in the memory cell formation regions 15a and 15c of FIG. 7. Configuration of the first through third conductive layers and the word lines to the active regions of the memory cell formation regions 55b and 55d differs from that in the memory cell formation regions 15b and 15d of FIG. 7. The difference will be described by focusing on the memory cell formation region 55b.

The first conductive layer 56a extends from an area on the active region 52e to an area on the active region 52h to be a gate electrode for the load transistor $Q_6$ and the driver transistor $Q_4$.

The second conductive layer 56b branches from the first conductive layer 56a on the field oxide region 53 and is electrically connected to the drain connecting wiring 30b via a contact hole 58b in the contact region 59. The width of the second conductive layer 56b on the field oxide region 53 is less than the width of the first conductive layer 56a.

The third conductive layer 56c is electrically connected to the drain connecting wiring 30a via a contact hole 58a in the contact region 57, passes across the active region 52d, and extends to an area on the active region 52g. The third conductive layer 56c is a gate electrode for the load transistor $Q_5$ and the driver transistor $Q_3$.

The word line 54b extends from an area on the active region 52h to an area on the active region 52g to be a gate electrode for the transfer transistors $Q_2$ and $Q_1$.

FIG. 22 is a plan view showing the source and drain regions formed in the active regions 52a to 52i on the main surface of the silicon substrate 68 using the word lines 54a and 54b and the first through third conductive layers 56a to 56c as masks. The hatched areas in the active regions 52a to 52i are the source and drain regions. The source and drain regions in the active regions 52a to 52c and 52g to 52i are n-type, and the source and drain regions in the active regions 52d to 52f are p-type. The structure shown in FIG. 22 is as described above. The wirings formed on the element formation layer shown in FIG. 22 are the same as those in the first embodiment as shown in FIG. 16. Therefore, further description is omitted.

Description of Sectional Structure

Figure 27:
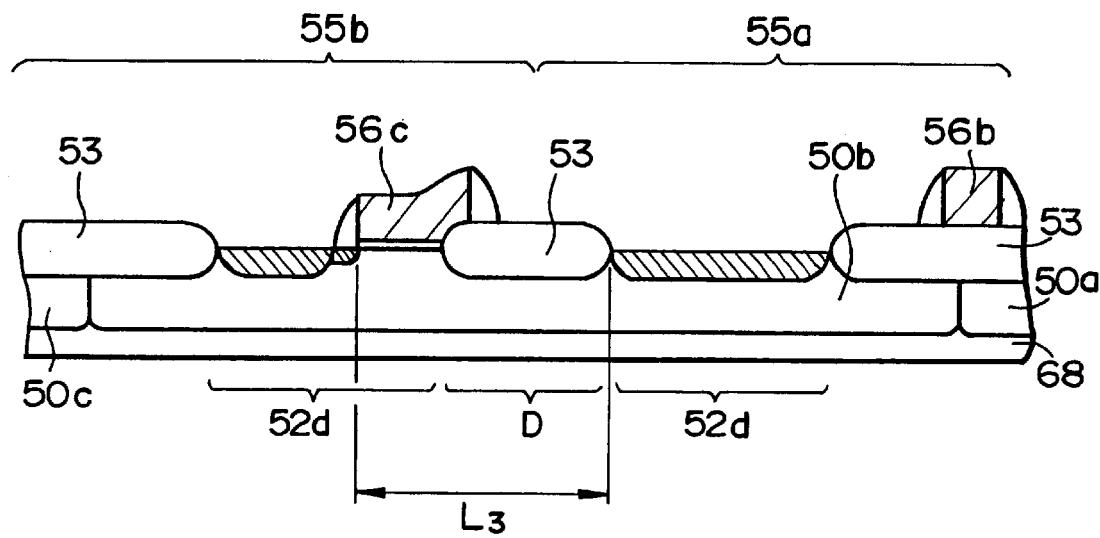
FIG. 27 is a cross section of the memory cell of the SRAM shown in FIG. 22 taken along the B—B line.
Figure 28:
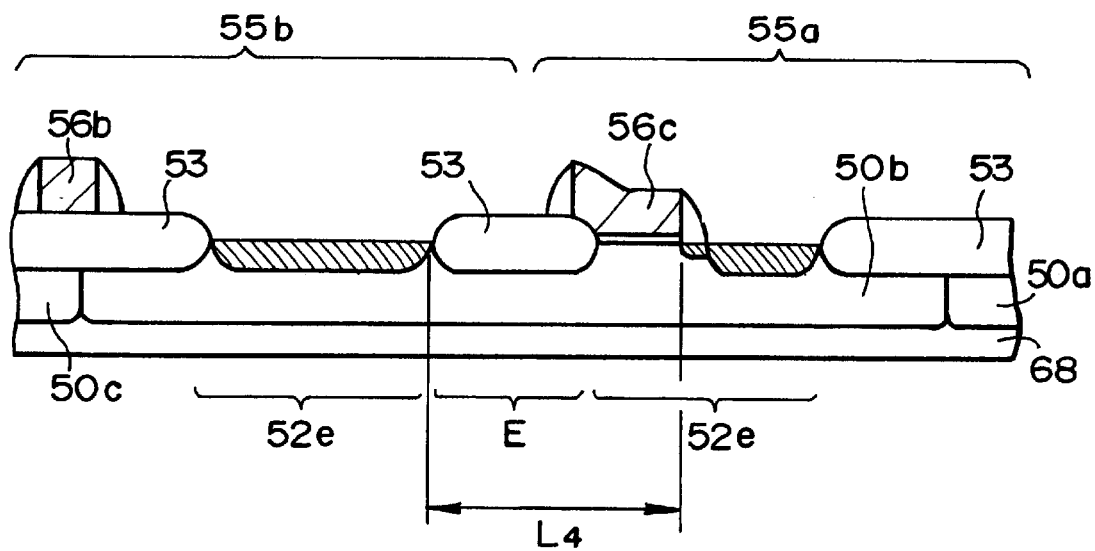
FIG. 28 is a cross section of the memory cell of the SRAM shown in FIG. 22 taken along the C—C line.

FIG. 27 is a cross section of the memory cell of the SRAM shown in FIG. 22 taken along the B—B line. FIG. 28 is a cross section of the memory cell of the SRAM shown in FIG. 22 taken along the C—C line.

As shown in FIGS. 27 and 28, the p-type well 50a, the n-type well 50b, and the p-type well 50c are formed on the main surface of the silicon substrate 68. The active regions 52d and 52e are formed in the n-type well 50b. The active regions 52d and 52e are separated by a field oxide region 53.

As shown in FIG. 27, the third conductive layer 56c is formed on the active region 52d. Part of the third conductive layer 56c is positioned on the field oxide region 53. The second conductive layer 56b is formed on a field oxide region 53 positioned at the boundary between the n-type well 50b and the p-type well 50a.

As shown in FIG. 28, the third conductive layer 56c is formed on the active region 52e and part of the third conductive layer 56c is positioned on a field oxide region 53. The second conductive layer 56b is formed on the field oxide region 53 positioned at the boundary between the n-type well 50b and the p-type well 50c.

Description of Effect

The third embodiment has the effects described below in addition to the same effects (Effects 1 to 3) as in the first embodiment.

As shown in FIG. 22, the pattern of the first through third conductive layers 56a, 56b, and 56c in the memory cell formation region 55b is a pattern formed by rotating the pattern of the first through third conductive layers 56a, 56b, and 56c in the memory cell formation region 55a by 180 degrees around an axis perpendicular to the main surface of the silicon substrate 68. This structure prevents punch-through in the regions D and E below the field oxide region 53.

Specifically, an end portion of the active region 52d included within the memory cell formation region 55b faces another end portion of the active region 52d included within the memory cell formation region 55a, with the region D interposed between them. The third conductive layer 56c in the memory cell formation region 55b passes over this end portion of the active region 52d within the memory cell formation region 55b. As shown in FIG. 27, since the third conductive layer 56c as well as the field oxide region 53 exists between a region to be a source region or drain region of the memory cell formation region 55b (the hatched area) and a region to be a source region or drain region of the memory cell formation region 55a (the hatched area), the distance $L_3$ can be lengthened by the width of the third conductive layer. The same effect is obtained in the region E in FIGS. 22 and 28.

Figure 29:
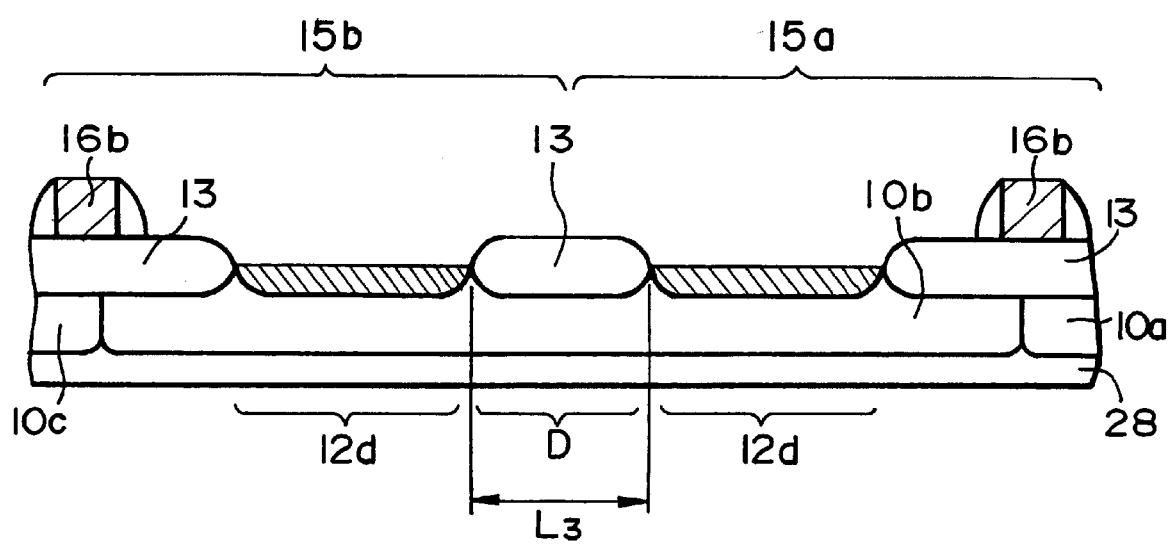
FIG. 29 is a cross section of the memory cell of the SRAM shown in FIG. 1 taken along the B—B line.
Figure 30:
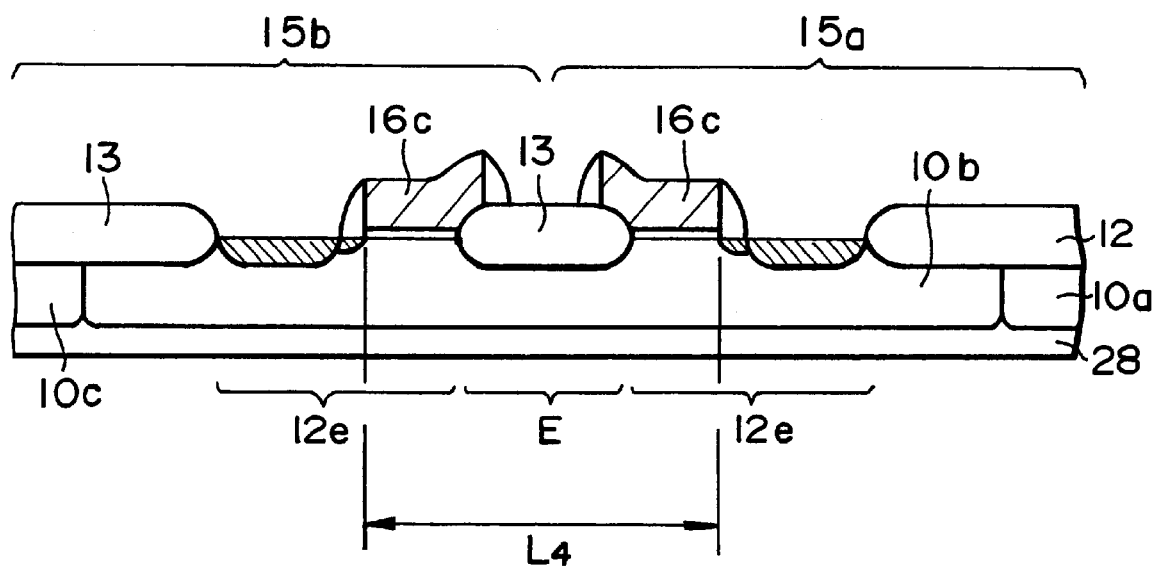
FIG. 30 is a cross section of the memory cell of the SRAM shown in FIG. 1 taken along the C—C line.

FIG. 29 is a cross section of the memory cell of the SRAM shown in FIG. 1 taken along the B—B line. FIG. 30 is a cross section of the memory cell of the SRAM shown in FIG. 1 taken along the C—C line. This structure can prevent punch-through in the region E below a field oxide region 53, but punch-through tends to occur in the region D below the field oxide region 53.

Specifically, as shown in FIG. 1, an end portion of the active region 12e included within the memory cell formation region 15b faces another end portion of the active region 12e included within the memory cell formation region 15a, with the region E interposed between them. The third conductive layer 16c in the memory cell formation region 15b passes over this end portion of the active region 12e within the memory cell formation region 15b. The third conductive layer 16c in the memory cell formation region 15a passes over the other end portion of the active region 12e within the memory cell formation region 15a. As shown in FIG. 30, since two third conductive layers 16c as well as the field oxide region 13 exists between a region to be a source region or drain region in the memory cell formation region 15b (the hatched area) and a region to be a source region or drain region in the memory cell formation region 15a (the hatched area), the distance $L_4$ can be larger than the distance $L_4$ of FIG. 25 by the width of the third conductive layers.

As shown in FIG. 1, an end portion of the active region 12d included within the memory cell formation region 15b faces another end portion of the active region 12d included within the memory cell formation region 15a, with the region D interposed between them. However, the third conductive layer 16c in the memory cell formation region 15b does not pass over this end portion of the active region 12d within the memory cell formation region 15b. The third conductive layer 16c in the memory cell formation region 15a does not pass over the other end portion of the active region 12d within the memory cell formation region 15a, either.

Because of this, as shown FIG. 29, only the field oxide region 13 exists between a region to be a source region or drain region in the memory cell formation region 15b (the hatched area) and a region to be a source region or drain region in the memory cell formation region 15a (the hatched area), so that the distance $L_3$ cannot be lengthened, causing punch-through to occur in the region D.

On the contrary, since the distance $L_3$ can be lengthened in the region shown by D in FIG. 27 by the width of the third conductive layer 56c as described in the third embodiment, punch-through can be prevented.

Fourth Embodiment

Figure 31:
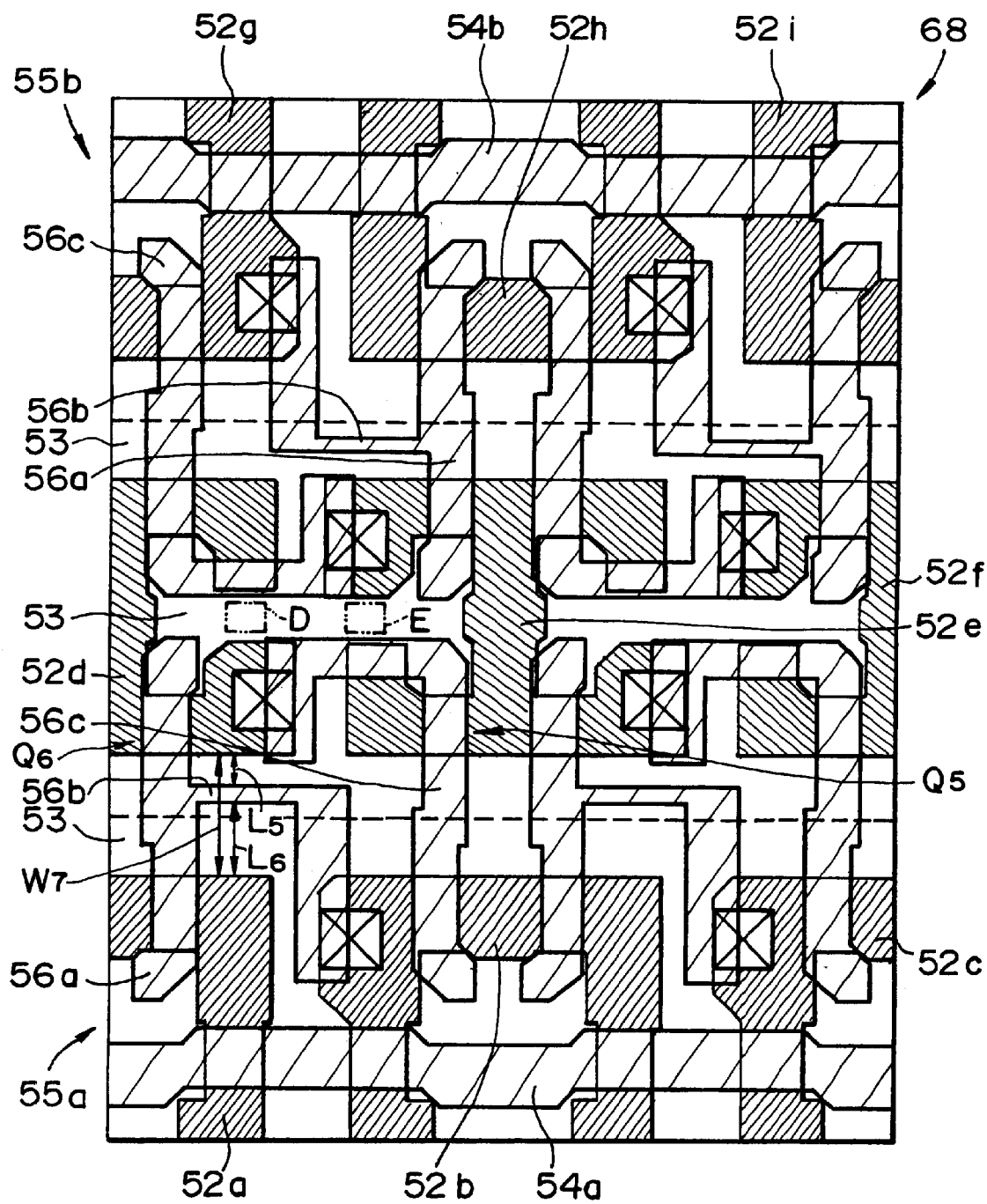
FIG. 31 is a plan view showing part of an element formation region of a memory cell array of an SRAM according to a fourth embodiment of the present invention.
Figure 32:
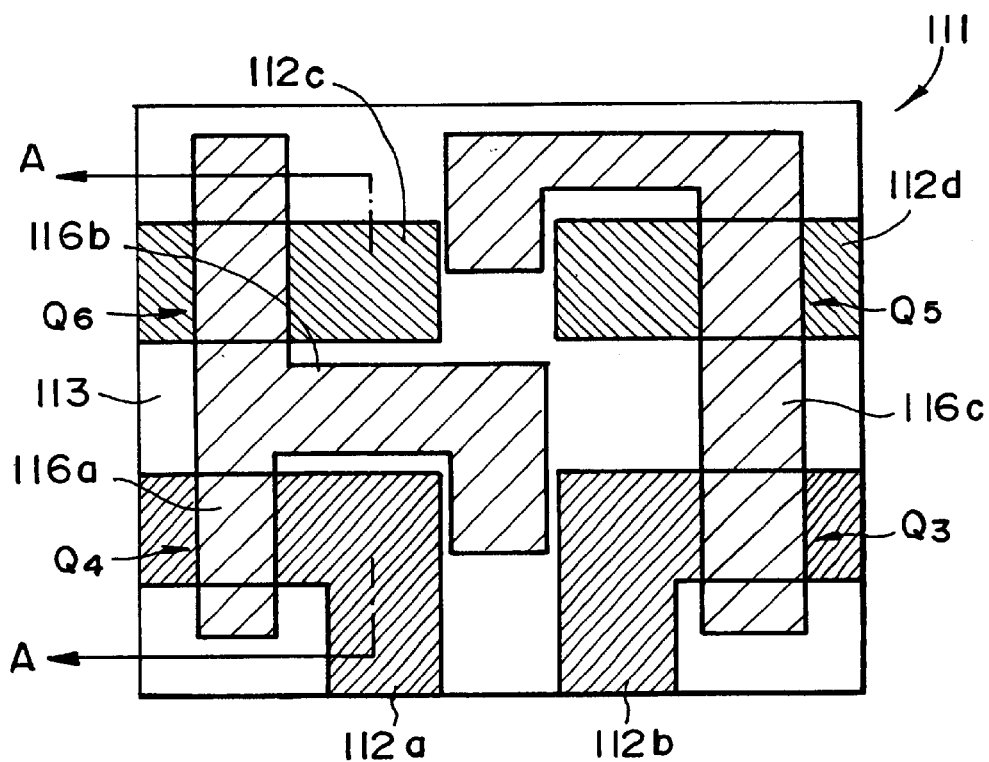
FIG. 32 is a plan view of a memory cell of a conventional SRAM.
Figure 33:
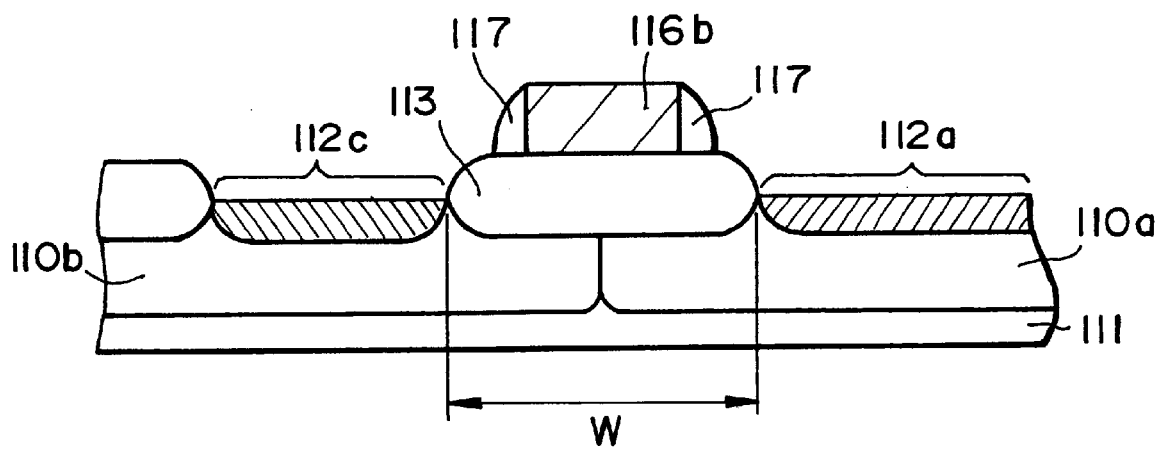
FIG. 33 is a cross section taken along the A—A line of the memory cell of the SRAM shown in FIG. 32.
Figure 34:
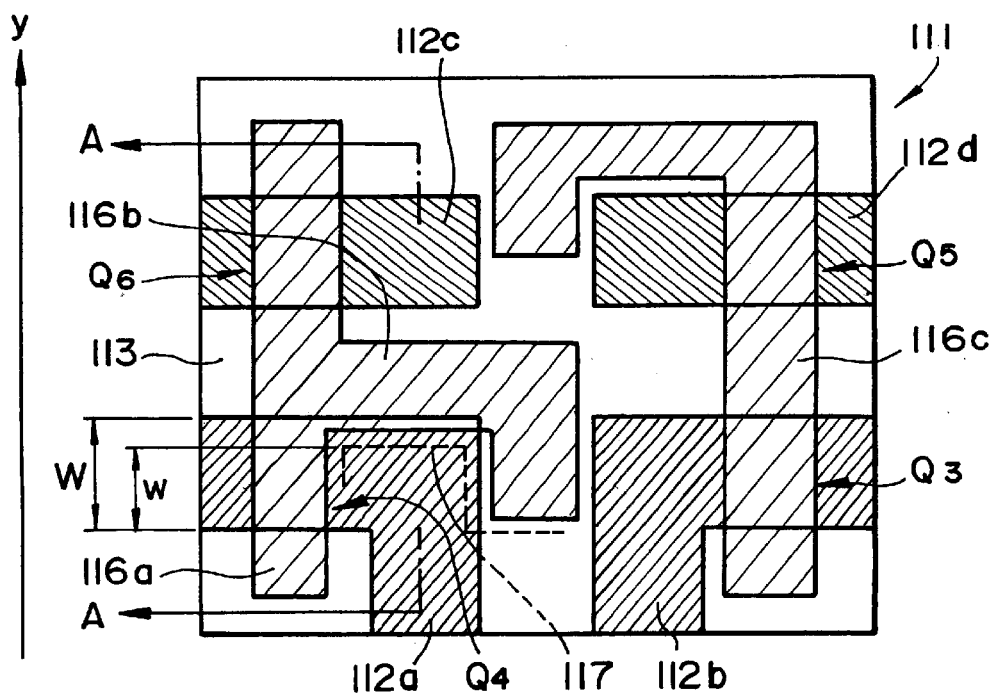
FIG. 34 is a plan view of a memory cell in the case where a mask alignment error occurs in the direction of Y axis when forming a first conductive layer, a second conductive layer, and a third conductive layer.
Figure 35:
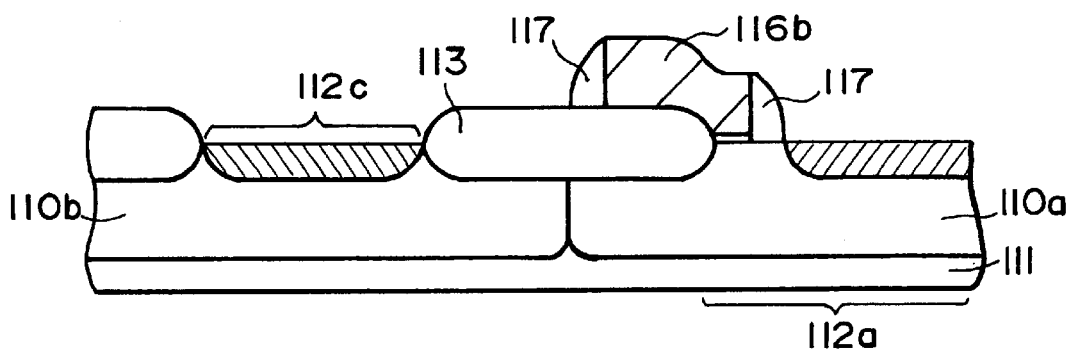
FIG. 35 is a cross section of the memory cell of the SRAM shown in FIG. 34 taken along the A—A line.
Figure 36:
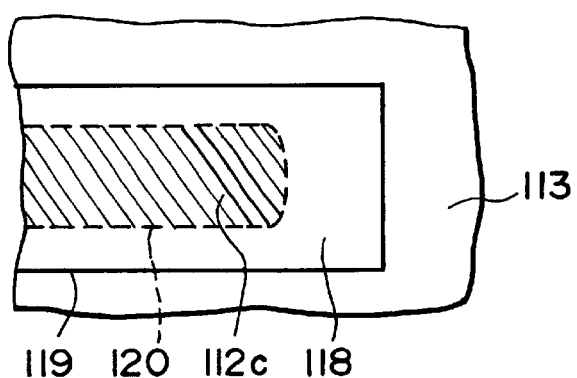
FIG. 36 is a plan view showing an end section of the active region shown in FIG. 32.

FIG. 31 is a plan view showing part of an element formation layer of a memory cell array of an SRAM according to a fourth embodiment of the present invention. In the fourth embodiment, the position of the second conductive layer 56b differs from that in the third embodiment. Specifically, the distance $L_5$ between the second conductive layer 56b and the active region 52d is less than the distance $L_6$ between the second conductive layer 56b and the active region 52a in the fourth embodiment. Since the other structure is same as in the third embodiment, further description is omitted by using the same symbols.

If the second conductive layer 56b and the side wall insulating film are positioned on the active region 52d and the gate width of the load transistor $Q_6$ is less, the β ratio of the memory cell is not affected. Accordingly, the distance $L_5$ between the second conductive layer 56b and the active region 52d can be less than the distance $L_6$ between the second conductive layer 56b and the active region 52a. Because of this, the width $W_7$ of the field oxide region 53 can be reduced, whereby the memory cell can be miniaturized.

In the fourth embodiment, since the structure other than the position of the second conductive layer 56b is same as in the third embodiment, above-described Effect 3 in the third embodiment can be achieved.

What is claimed is:

1. A semiconductor memory device having at least one memory cell that includes first and second load transistors and first and second driver transistors, the semiconductor memory device comprising:

a semiconductor substrate having a main surface;

a first load transistor active region which is formed on the main surface as an active region for the first load transistor;

a second load transistor active region which is formed on the main surface as an active region for the second load transistor;

a first driver transistor active region which is formed on the main surface as an active region for the first driver transistor;

a second driver transistor active region which is formed on the main surface as an active region for the second driver transistor;

a first element isolation region which is formed on the main surface to isolate the first load transistor active region from the first driver transistor active region;

a first conductive layer which extends from an area on the first load transistor active region to an area on the first driver transistor active region to be a gate electrode for the first load transistor and for the first driver transistor;

a second conductive layer which branches from the first conductive layer on the first element isolation region and is electrically connected to the second driver transistor active region, wherein the width of part of the second conductive layer positioned on the first element isolation region is less than the width of the first conductive layer; and a third conductive layer which is electrically connected to the first load transistor active region, passes across the second load transistor active region, and extends to an area on the second driver transistor active region to be a gate electrode for the second load transistor and the second driver transistor.

2. The semiconductor memory device as defined in claim 1, further comprising a side wall insulating film formed on the side surface of the second conductive layer on side of the first driver transistor active region, wherein the distance between part of the second conductive layer on the first element isolation region and the first driver transistor active region is larger than the sum of the value of an alignment error produced at the time of patterning for the first, second and third conductive layers of the memory cell and the width of the side wall insulating film.

3. The semiconductor memory device as defined in claim 1, wherein the distance between part of the second conductive layer on the first element isolation region and the first load transistor active region is less than the distance between the second conductive layer on the first element isolation region and the first driver transistor active region.

4. The semiconductor memory device as defined in claim 1, wherein the pattern of the first and second conductive layers is in the shape of an "h" and the pattern of the third conductive layer is in the shape of a "7".

5. The semiconductor memory device as defined in claim 1, wherein the width of a contact region of the first load transistor active region used for electrical connection with the third conductive layer is larger than the width of the other part of the first load transistor active region.

6. The semiconductor memory device as defined in claim 1, comprising a memory cell array that includes the memory cells, wherein the memory cell array includes a second element isolation region that is formed on the main surface for isolating a memory cell in a first line of the memory cell array from a memory cell in a second line of the memory cell array, and wherein the pattern of the first, second and third conductive layers of the memory cell in the second line of the memory cell array is a pattern formed by rotating the pattern of the first, second and third conductive layers of the memory cell in the first line of the memory cell array around an axis that is perpendicular to the main surface by 180 degrees.

7. The semiconductor memory device as defined in claim 1, comprising a memory cell array that includes the memory cells, wherein the memory cell array includes a second element isolation region that is formed on the main surface for isolating a memory cell in a first line of the memory cell array from a memory cell in a second line of the memory cell array, and wherein the pattern of the first, second and third conductive layers of the memory cell in the second line of the memory cell array is a mirror image of the pattern of the first, second and third conductive layers of the memory cell in the first line of the memory cell array.

8. A semiconductor memory device having at least one memory cell that includes first and second load transistors and first and second driver transistors, the semiconductor memory device comprising:

a semiconductor substrate having a main surface;

a first load transistor active region which is formed on the main surface as an active region for the first load transistor;

a second load transistor active region which is formed on the main surface as an active region for the second load transistor;

a first driver transistor active region which is formed on the main surface as an active region for the first driver transistor;

a second driver transistor active region which is formed on the main surface as an active region for the second driver transistor;

a first element isolation region which is formed on the main surface to isolate the first load transistor active region from the first driver transistor active region;

a first conductive layer which extends from an area on the first load transistor active region to an area on the first driver transistor active region to be a gate electrode for the first load transistor and the first driver transistor;

a second conductive layer which branches from the first conductive layer on the first element isolation region and is electrically connected to the second driver transistor active region, wherein the width of part of the second conductive layer positioned on the first element isolation region is the smallest width according to the processing rule for the second conductive layer; and a third conductive layer which is electrically connected to the first load transistor active region, passes across the second load transistor active region, and extends to an area on the second driver transistor active region to be a gate electrode for the second load transistor and the second driver transistor.

9. The semiconductor memory device as defined in claim 8, further comprising a side wall insulating film formed on the side surface of the second conductive layer on the side of the first driver transistor active region, wherein the distance between part of the second conductive layer on the first element isolation region and the first driver transistor active region is larger than the sum of the value of an alignment error produced at the time of patterning for the first, second and third conductive layers of the memory cell and the width of said side wall insulating film.

10. The semiconductor memory device as defined in claim 8, wherein the distance between part of the second conductive layer on the first element isolation region and the first load transistor active region is less than the distance between the second conductive layer on the first element isolation region and the first driver transistor active region.

11. The semiconductor memory device as defined in claim 8, wherein the pattern of the first and second conductive layers is in the shape of an "h" and the pattern of the third conductive layer is in the shape of a "7".

12. The semiconductor memory device as defined in claim 8, wherein the width of a contact region of the first load transistor active region used for electrical connection with the third conductive layer is larger than the width of the other part of the first load transistor active region.

13. The semiconductor memory device as defined in claim 8, comprising a memory cell array that includes the memory cells, wherein the memory cell array includes a second element isolation region that is formed on the main surface for isolating a memory cell in a first line of the memory cell array from a memory cell in a second line of the memory cell array, and wherein the pattern of the first, second and third conductive layers of the memory cell in the second line of the memory cell array is a pattern formed by rotating the pattern of the first, second and third conductive layers of the memory cell in the first line of the memory cell array around an axis that is perpendicular to the main surface by 180 degrees.

14. The semiconductor memory device as defined in claim 8, comprising a memory cell array that includes the memory cells, wherein the memory cell array includes a second element isolation region that is formed on the main surface for isolating a memory cell in a first line of the memory cell array from a memory cell in a second line of the memory cell array, and wherein the pattern of the first, second and third conductive layers of the memory cell in the second line of the memory cell array is a mirror image of the pattern of the first, second and third conductive layers of the memory cell in the first line of the memory cell array.

* * * * *